US012813278B2

(12) United States Patent
Lin et al.

(10) Patent No.: US 12,813,278 B2
(45) Date of Patent: Nov. 24, 2026

(54) CHIP PACKAGE STRUCTURE WITH ANCHOR STRUCTURE

(71) Applicant: Taiwan Semiconductor Manufacturing Company, Ltd., Hsinchu (TW)

(72) Inventors: Hui-Ting Lin, Tainan City (TW); Chin-Fu Kao, Taipei City (TW); Chen-Shien Chen, Zhubei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 596 days.

(21) Appl. No.: 18/361,177

(22) Filed: Jul. 28, 2023

(65) Prior Publication Data

US 2023/0369250 A1 Nov. 16, 2023

Related U.S. Application Data

(62) Division of application No. 17/313,229, filed on May 6, 2021, now Pat. No. 11,764,168.

(51) Int. Cl.
*H10W 42/00* (2026.01)
*H10W 78/00* (2026.01)
*H10W 95/00* (2026.01)

(52) U.S. Cl.
CPC ......... *H10W 42/121* (2026.01); *H10W 78/00* (2026.01); *H10W 95/00* (2026.01)

(58) Field of Classification Search
None
See application file for complete search history.

(56) References Cited

U.S. PATENT DOCUMENTS

2007/0257345 A1 11/2007 Fan et al.
2014/0061893 A1* 3/2014 Saeidi .................. H10W 40/22 438/122
2014/0252634 A1 9/2014 Hung
2018/0301355 A1 10/2018 Sinha et al.
2018/0342466 A1 11/2018 Lin et al.
2021/0057354 A1 2/2021 Eid

FOREIGN PATENT DOCUMENTS

TW 200743192 A 11/2007

OTHER PUBLICATIONS

Chinese language office action dated Aug. 11, 2022, issued in application No. TW 111104735.

* cited by examiner

*Primary Examiner* — Bo B Jang
(74) *Attorney, Agent, or Firm* — McClure, Qualey & Rodack, LLP

(57) ABSTRACT

A chip package structure is provided. The chip package structure includes a wiring substrate having a first conductive pad. The chip package structure includes a chip structure over the wiring substrate. The chip package structure includes an antiwarpage structure over the wiring substrate. The antiwarpage structure surrounds the chip structure. The chip package structure includes a first anchor structure on the first conductive pad of the wiring substrate and adjacent to a first lower portion of the antiwarpage structure. The first lower portion is between the first anchor structure and the chip structure, and the first anchor structure and the first conductive pad are electrically insulated from the chip structure.

20 Claims, 37 Drawing Sheets

CHIP PACKAGE STRUCTURE WITH ANCHOR STRUCTURE

CROSS REFERENCE

This application is a Divisional of U.S. application Ser. No. 17/313,229, filed on May 6, 2021, now U.S. Pat. No. 11,764,168, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating layers or dielectric layers, conductive layers, and semiconductor layers over a semiconductor substrate, and patterning the various material layers using photolithography processes and etching processes to form circuit components and elements thereon.

Many integrated circuits (IC) are typically manufactured on a semiconductor wafer. Technological advances in IC materials and design have produced generations of ICs. Each generation has smaller and more complex circuits than the previous generation. The dies of the wafer may be processed and packaged at the wafer level, and various technologies have been developed for wafer level packaging. Since the chip package structure may need to include multiple chips with multiple functions, it is a challenge to form a reliable chip package structure with multiple chips.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1F-1 is a top view of the chip package structure of FIG. 1F, in accordance with some embodiments.

DETAILED DESCRIPTION

Figure 1A:
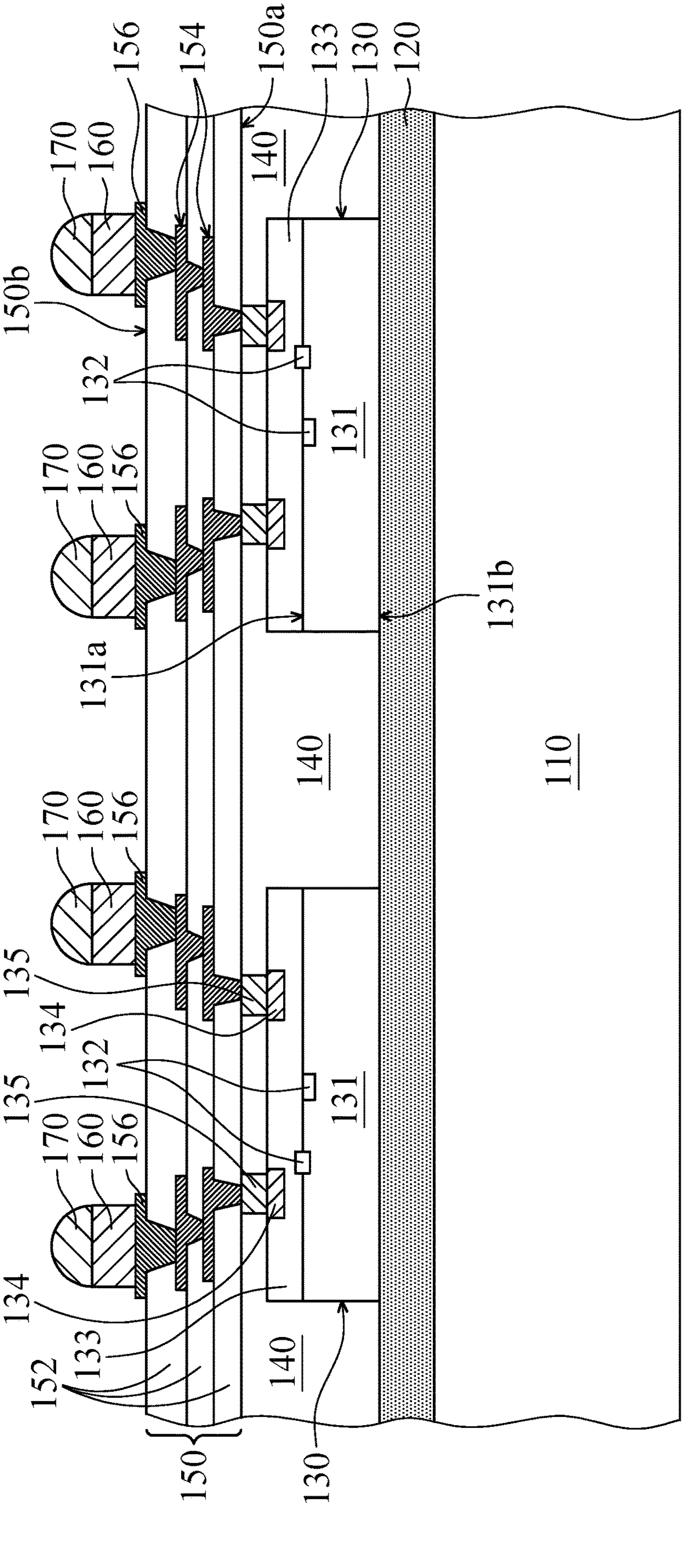
FIGS. 1A-1F are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1F are cross-sectional views of various stages of a process for forming a chip package structure, in accordance with some embodiments. As shown in FIG. 1A, a carrier substrate 110 is provided, in accordance with some embodiments. The carrier substrate 110 is configured to provide temporary mechanical and structural support during subsequent processing steps, in accordance with some embodiments.

The carrier substrate 110 includes glass, silicon oxide, aluminum oxide, metal, a combination thereof, and/or the like, in accordance with some embodiments. The carrier substrate 110 includes a metal frame, in accordance with some embodiments.

As shown in FIG. 1A, an adhesive layer 120 is formed over the carrier substrate 110, in accordance with some embodiments. The adhesive layer 120 includes an insulating material, such as a polymer material including an ultraviolet (UV) glue or a Light-to-Heat Conversion (LTHC) glue, which loses its adhesive properties when exposed to a UV light or laser, in accordance with some embodiments. The adhesive layer 120 is formed using a lamination process, a spin coating process, a printing process, or another suitable process.

As shown in FIG. 1A, chips 130 are provided, in accordance with some embodiments. Each of the chips 130 includes a substrate 131, electronic elements 132, a dielectric layer 133, bonding pads 134, and conductive structures 135, in accordance with some embodiments.

The substrate 131 is also referred to as a semiconductor substrate, a system-on-chip (SoC), a logic die, or a memory die, in accordance with some embodiments. In some embodiments, the substrate 131 is made of at least an elementary semiconductor material including silicon or germanium in a single crystal, polycrystal, or amorphous structure.

In some other embodiments, the substrate 131 is made of a compound semiconductor, such as silicon carbide, gallium arsenide, gallium phosphide, indium phosphide, indium arsenide, an alloy semiconductor, such as SiGe or GaAsP, or a combination thereof. The substrate 131 may also include multi-layer semiconductors, semiconductor on insulator (SOI) (such as silicon on insulator or germanium on insulator), or a combination thereof.

The substrate 131 has a front surface 131*a* and a back surface 131*b* opposite to the front surface 131*a*, in accordance with some embodiments. In some embodiments, the electronic elements 132 are formed on the front surface 131*a* or in the substrate 131 adjacent to the front surface 131*a*. The electronic elements 132 include active elements (e.g. transistors, diodes, or the like) and/or passive elements (e.g. resistors, capacitors, inductors, or the like).

In some embodiments, active elements and passive elements are not formed on the back surface 131*b* or in the substrate 131 adjacent to the back surface 131*b*. That is, there is no active element and no passive element formed directly on the back surface 131*b* or in the substrate 131 adjacent to the back surface 131*b*. In some other embodiments, active elements and passive elements are formed on the back surface 131*b* or in the substrate 131 adjacent to the back surface 131*b*.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the electronic elements 132. The FEOL semiconductor fabrication processes may include deposition, etching, implantation, photolithography, annealing, planarization, one or more other applicable processes, or a combination thereof.

In some embodiments, isolation features (not shown) are formed in the substrate 131. The isolation features are used to surround active regions of the substrate 131 and electrically isolate the electronic elements 132 formed in and/or over the substrate 131 in the active regions. In some embodiments, the isolation features include shallow trench isolation (STI) features, local oxidation of silicon (LOCOS) features, other suitable isolation features, or a combination thereof.

As shown in FIG. 1A, in each of the chips 130, the dielectric layer 133 is formed over the substrate 131, in accordance with some embodiments. The bonding pads 134 are formed in the dielectric layer 133, in accordance with some embodiments. The bonding pads 134 are electrically connected to the electronic elements 132 through an interconnect structure (not shown) in the dielectric layer 133, in accordance with some embodiments. The bonding pads 134 are made of a conductive material, such as metal (e.g., copper or aluminum) or alloys thereof, in accordance with some embodiments.

As shown in FIG. 1A, the conductive structures 135 are formed over the respective bonding pads 134, in accordance with some embodiments. The conductive structures 135 are electrically connected to the bonding pads 134 thereunder, in accordance with some embodiments.

The conductive structures 135 include conductive pillars, in accordance with some embodiments. The conductive structures 135 are also referred to as conductive bumps, in accordance with some embodiments. The conductive structures 135 are made of a conductive material, such as metal (e.g. copper, aluminum, or tungsten) or alloys thereof, in accordance with some embodiments.

As shown in FIG. 1A, chips 130 are bonded to the adhesive layer 120, in accordance with some embodiments. As shown in FIG. 1A, a molding layer 140 is formed over the adhesive layer 120 to surround the chips 130, in accordance with some embodiments. The molding layer 140 is made of a polymer material or another suitable insulating material, in accordance with some embodiments.

As shown in FIG. 1A, a redistribution structure 150 is formed over the molding layer 140 and the chips 130, in accordance with some embodiments. The redistribution structure 150 has surfaces 150*a* and 150*b*, in accordance with some embodiments. The surface 150*b* is opposite to the surface 150*a*, in accordance with some embodiments. The surface 150*a* faces the carrier substrate 110, in accordance with some embodiments.

The redistribution structure 150 includes a dielectric structure 152, a wiring structure 154, and conductive pads 156, in accordance with some embodiments. The dielectric structure 152 includes a multilayer structure, in accordance with some embodiments. In some other embodiments, the dielectric structure 152 includes a single layer structure.

The wiring structure 154 is formed in the dielectric structure 152, in accordance with some embodiments. The wiring structure 154 includes wiring layers and conductive vias connected between the wiring layers, the conductive pads 156, and the conductive structures 135, in accordance with some embodiments. The conductive pads 156 are formed over the dielectric structure 152 and extend into the dielectric structure 152 to be electrically connected to the wiring structure 154, in accordance with some embodiments.

The dielectric structure 152 is made of an insulating material such as a polymer material (e.g., polybenzoxazole or polyimide), nitride (e.g., silicon nitride), oxide (e.g., silicon oxide), silicon oxynitride, or the like, in accordance with some embodiments. The dielectric structure 152 is formed using a coating process, a deposition process, or another suitable process. The wiring structure 154 and the conductive pads 156 are made of a conductive material, such as metal (e.g. copper, aluminum, or tungsten) or alloys thereof, in accordance with some embodiments.

As shown in FIG. 1A, conductive pillars 160 are formed over the conductive pads 156 of the redistribution structure 150, in accordance with some embodiments. The conductive pillars 160 are made of metal (e.g. copper, aluminum, or tungsten) or alloys thereof, in accordance with some embodiments. The conductive pillars 160 are formed using a plating process, such as an electroplating process, in accordance with some embodiments.

Thereafter, as shown in FIG. 1A, solder bumps 170 are formed over the respective conductive pillars 160, in accordance with some embodiments. The solder bumps 170 are made of a conductive material, such as a tin-based alloy, in accordance with some embodiments.

Figure 1B:
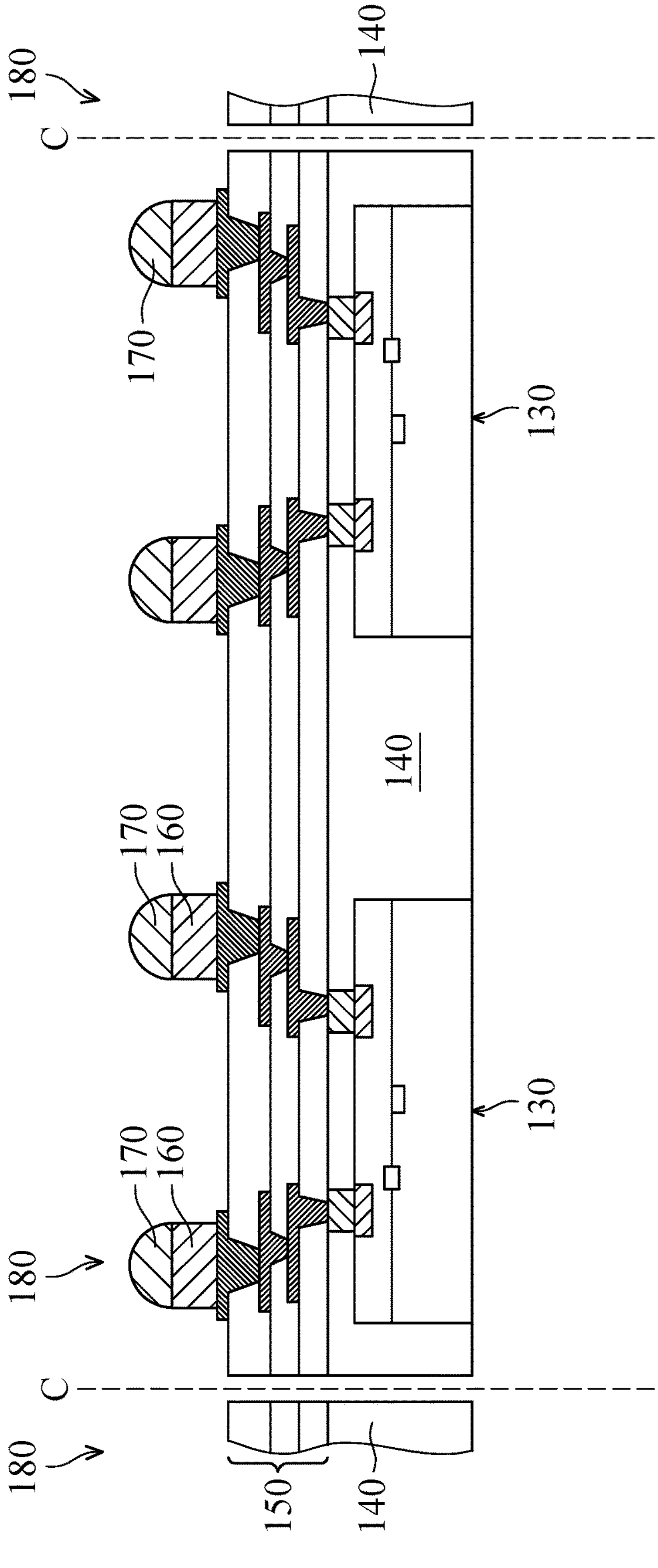

As shown in FIG. 1B, a cutting process is performed along cutting lines C to cut through the redistribution structure 150 and the molding layer 140 so as to form chip structures 180, in accordance with some embodiments.

Figure 1C:
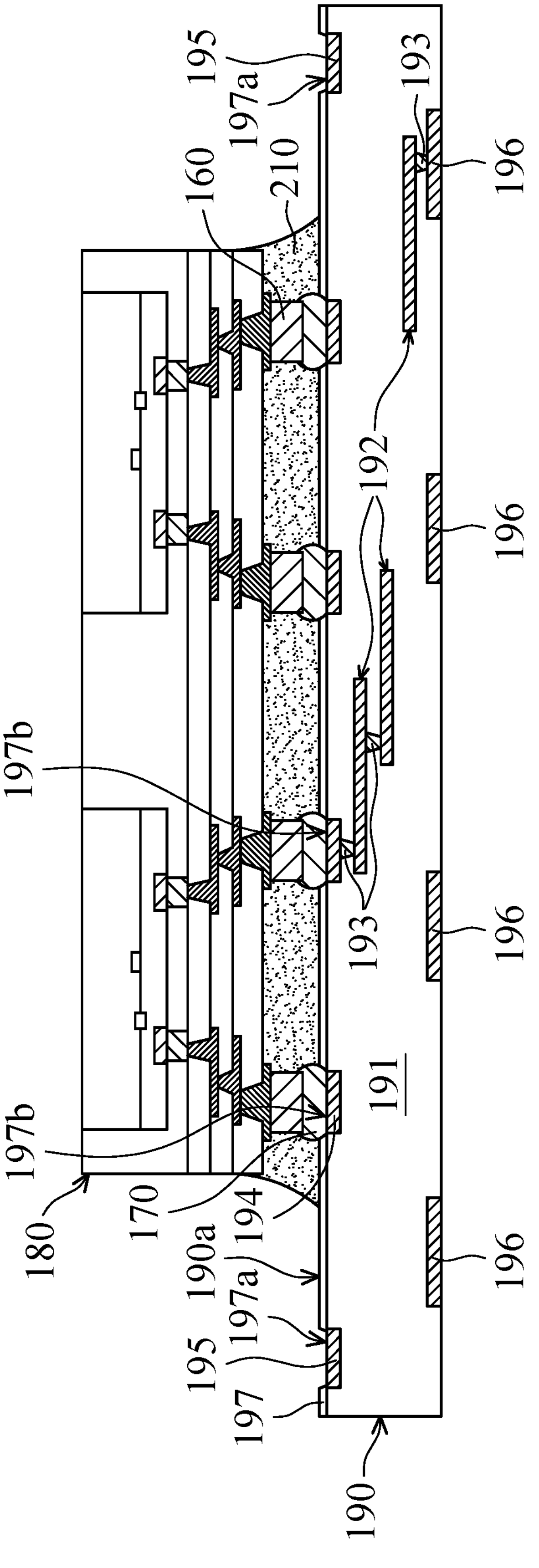

As shown in FIG. 1C, one of the chip structures 180 is bonded to a surface 190*a* of a wiring substrate 190, in accordance with some embodiments. The wiring substrate 190 includes a dielectric layer 191, wiring layers 192, conductive vias 193, conductive pads 194, 195 and 196, and an insulating layer 197, in accordance with some embodiments.

The wiring layers 192 and the conductive vias 193 are formed in the dielectric layer 191, in accordance with some embodiments. The conductive pads 194 and 195 are formed over the dielectric layer 191, in accordance with some embodiments. The conductive pads 196 are formed under the dielectric layer 191, in accordance with some embodiments.

As shown in FIG. 1C, the conductive vias 193 are electrically connected between the wiring layers 192 and the conductive pads 194, 195 and 196, in accordance with some embodiments. For the sake of simplicity, FIG. 1C only shows three of the wiring layers 192, in accordance with some embodiments.

The insulating layer 197 has openings 197*a* and 197*b*, in accordance with some embodiments. The openings 197*a* expose the conductive pads 195 thereunder, in accordance with some embodiments. The openings 197*b* expose the conductive pads 194 thereunder, in accordance with some embodiments. The solder bumps 170 are bonded to the conductive pads 194 through the openings 197*b*, in accordance with some embodiments.

The dielectric layer 191 is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The dielectric layer 191 is formed using deposition processes (e.g. chemical vapor deposition processes or physical vapor deposition processes), photolithography processes, and etching processes, in accordance with some embodiments.

The wiring layers 192, the conductive vias 193, and the conductive pads 194, 195 and 196 are made of a conductive material, such as metal (e.g. copper, aluminum, or tungsten) or alloys thereof, in accordance with some embodiments. The insulating layer 197 is made of an insulating material, such as a polymer material (e.g., a solder resist material), in accordance with some embodiments.

The chip structure 180 is bonded to the conductive pads 194 through the conductive pillars 160 and the solder bumps 170, in accordance with some embodiments. The conductive pillars 160 and the solder bumps 170 are physically and electrically connected between the chip structure 180 and the wiring substrate 190, in accordance with some embodiments.

Figure 1D:
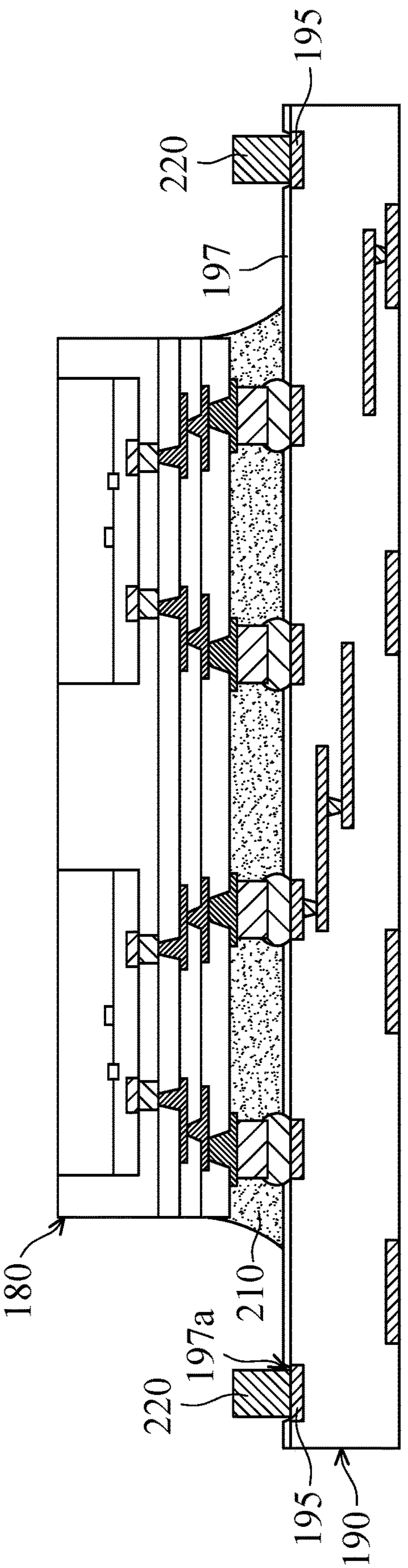

As shown in FIG. 1D, anchor structures 220 are formed over the respective conductive pads 195 of the wiring substrate 190, in accordance with some embodiments. The anchor structures 220 are affixed to the conductive pads 195, in accordance with some embodiments. The anchor structures 220 are in the respective openings 197*a* of the insulating layer 197, in accordance with some embodiments. The anchor structures 220 and the conductive pads 195 are electrically isolated from the chip structure 180, in accordance with some embodiments.

The anchor structures 220 are made of a rigid material, such as metal (iron, copper, aluminum, or tungsten) or alloys thereof, in accordance with some embodiments. The rigidity of the anchor structures 220 is greater than the rigidity of the wiring substrate 190, in accordance with some embodiments.

The hardness of the anchor structures 220 is greater than the hardness of the wiring substrate 190, in accordance with some embodiments. The anchor structures 220 are formed using a plating process, such as an electroplating process, in accordance with some embodiments.

Figure 1E:
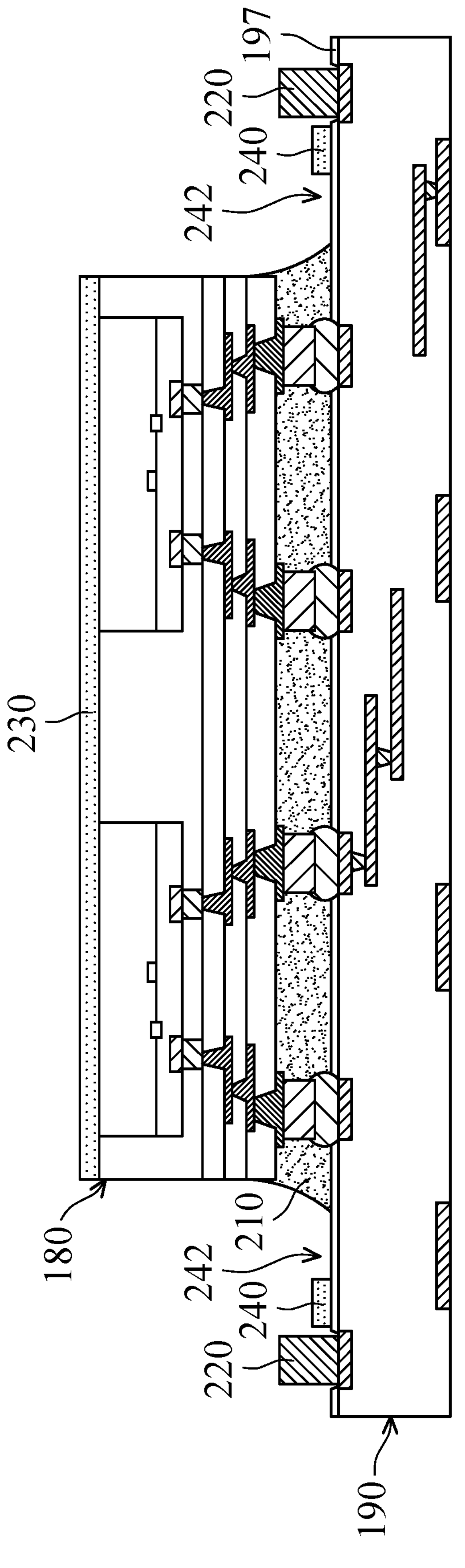

As shown in FIG. 1E, adhesive layers 230 and 240 are respectively formed over the chip structure 180 and the wiring substrate 190, in accordance with some embodiments. The adhesive layer 240 is over the insulating layer 197 of the wiring substrate 190, in accordance with some embodiments. The adhesive layer 240 has an opening 242, in accordance with some embodiments. The chip structure 180 is in the opening 242, in accordance with some embodiments.

The adhesive layer 240 is between the chip structure 180 and the anchor structures 220, in accordance with some embodiments. The anchor structures 220 are closer to the adhesive layer 240 than the chip structure 180, in accordance with some embodiments. The adhesive layers 230 and 240 are made of a polymer material such as epoxy or silicone, in accordance with some embodiments.

Figure 1F:
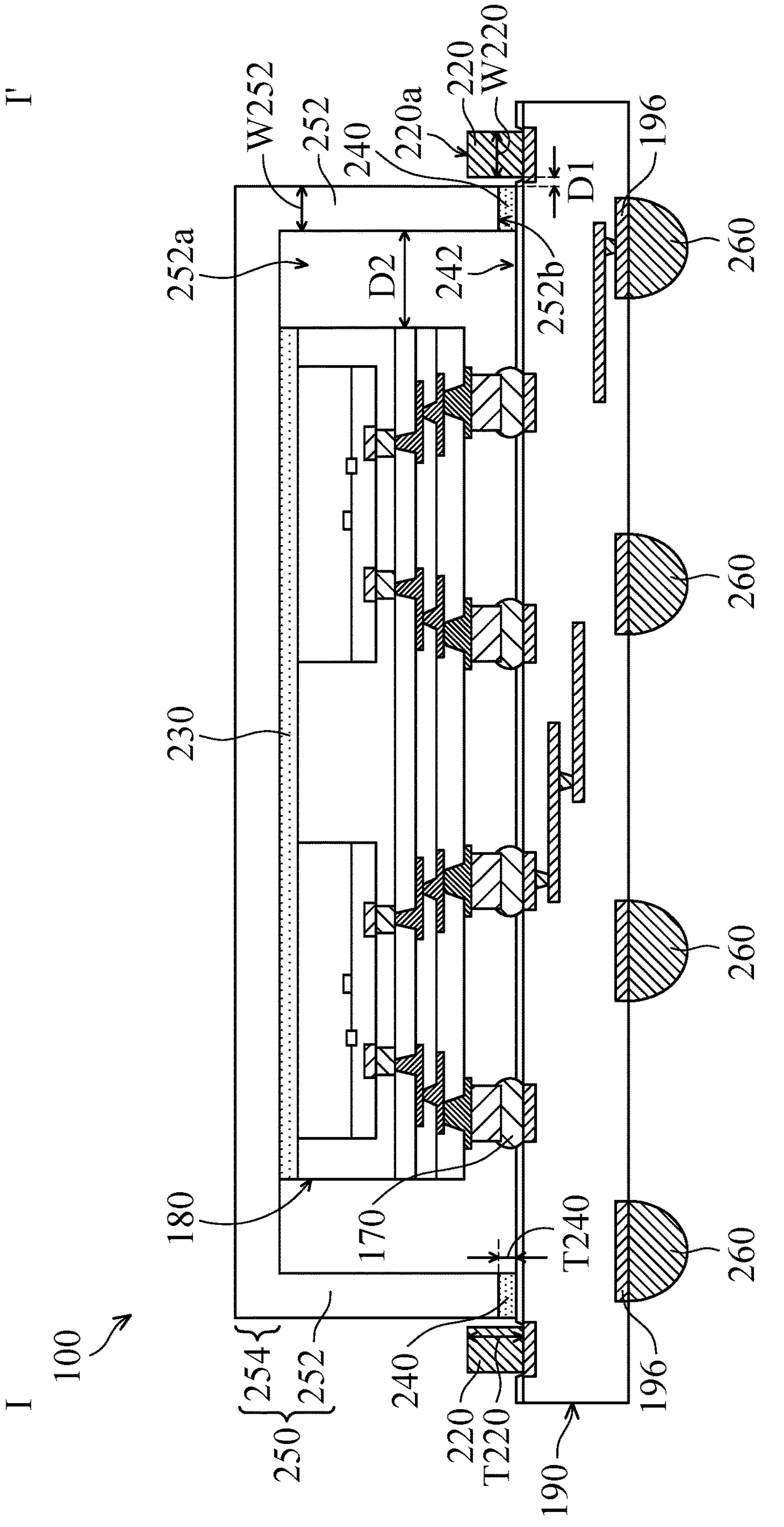
Figures 1, 1F:
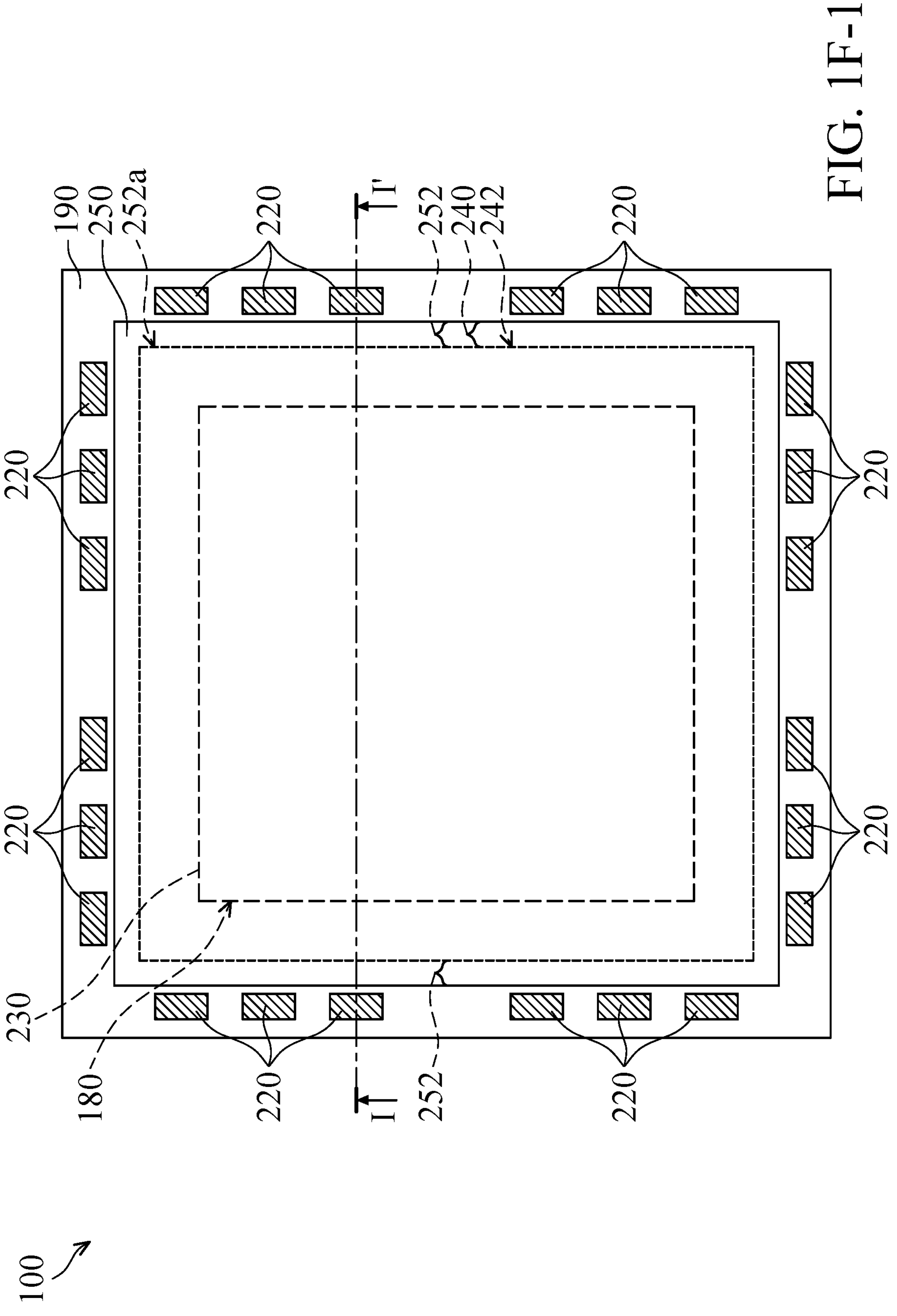

FIG. 1F-1 is a top view of the chip package structure of FIG. 1F, in accordance with some embodiments. FIG. 1F is a cross-sectional view illustrating the chip package structure along a sectional line I-I' in FIG. 1F-1, in accordance with some embodiments. As shown in FIGS. 1F and 1F-1, an antiwarpage structure 250 is bonded to the adhesive layers 230 and 240, in accordance with some embodiments. As shown in FIG. 1F, conductive bumps 260 are formed over the respective conductive pads 196 of the wiring substrate 190, in accordance with some embodiments. In this step, a chip package structure 100 is substantially formed, in accordance with some embodiments.

As shown in FIGS. 1F and 1F-1, the antiwarpage structure 250 is a cap structure, in accordance with some embodiments. In some embodiments, the antiwarpage structure 250 is used to reduce the warpage of the wiring substrate 190. In some embodiments, the antiwarpage structure 250 is used as a heat dissipation structure.

In some embodiments, the antiwarpage structure 250 includes a lower portion 252 and an upper portion 254, in accordance with some embodiments. The upper portion 254 includes a flat structure, in accordance with some embodiments. As shown in FIG. 1F-1, the lower portion 252 includes a ring structure having an opening 252*a*, in accordance with some embodiments. The lower portion 252 continuously surrounds the entire chip structure 180, in accordance with some embodiments.

As shown in FIG. 1F-1, the adhesive layer 240 includes a ring structure having the opening 242, in accordance with some embodiments. As shown in FIGS. 1F and 1F-1, the chip structure 180 and the adhesive layer 230 are in the openings 252*a* and 242, in accordance with some embodiments. The lower portion 252 is bonded to the adhesive layer 240, in accordance with some embodiments.

The upper portion 254 is bonded to the adhesive layer 230, in accordance with some embodiments. The lower portion 252 is between the chip structure 180 and the anchor structures 220, in accordance with some embodiments. The chip structure 180 and the antiwarpage structure 250 are between some of the anchor structures 220, in accordance with some embodiments.

The anchor structures 220 are used as bonding guide structures (or bonding guide pins) to align the lower portion 252 with the adhesive layer 240 during bonding the lower portion 252 to the adhesive layer 240, in accordance with some embodiments. Therefore, the bonding accuracy between the lower portion 252 and the adhesive layer 240 is improved, which improves the adhesion between the antiwarpage structure 250 and the wiring substrate 190 and therefore reduces the warpage of the wiring substrate 190, in accordance with some embodiments.

As a result, the coplanarity of the conductive bumps 260, which are formed over the wiring substrate 190, is improved, which improves the yield of the process of bonding the chip package structure 100 to a substrate or another device through the conductive bumps 260, in accordance with some embodiments.

Furthermore, the thermal stress between the solder bumps 170 and the wiring substrate 190 is decreased, which prevents the formation of cracks in the solder bumps 170, in accordance with some embodiments. As a result, the reliability of the chip package structure 100 is improved, in accordance with some embodiments.

Furthermore, the anchor structures 220 are able to limit the antiwarpage structure 250 in a predetermined region, which prevents the antiwarpage structure 250 from shifting (or moving) in subsequent processes, in accordance with some embodiments. Therefore, the anchor structures 220 are able to improve the structural stability of the chip package structure 100, in accordance with some embodiments.

The anchor structures 220 are closer to the lower portion 252 than the chip structure 180, in accordance with some embodiments. That is, the distance D1 between the lower portion 252 and the anchor structure 220 is less than the distance D2 between the lower portion 252 and the chip structure 180, in accordance with some embodiments.

The distance D1 ranges from about 0 to about 100 μm, in accordance with some embodiments. In some embodiments, the lower portion 252 is in direct contact with the anchor structures 220, in accordance with some embodiments. If the distance D1 is greater than 100 μm, the anchor structures 220 may be unable to guide the antiwarpage structure 250 in the bonding process, in accordance with some embodiments.

The distance D1 is less than or equal to a width W252 of the lower portion 252, in accordance with some embodiments. The width W252 ranges from about 400 μm to about 4000 μm, in accordance with some embodiments. The distance D1 is less than or equal to a width W220 of the anchor structure 220, in accordance with some embodiments. The width W220 ranges from about 100 μm to about 500 μm, in accordance with some embodiments.

As shown in FIG. 1F, top surfaces 220*a* of the anchor structures 220 are higher than a bottom surface 252*b* of the lower portion 252, which helps the anchor structures 220 to limit the shift (or the relative movement) of the antiwarpage structure 250 resulting from a coefficient of thermal expansion (CTE) mismatch between the antiwarpage structure 250 (or the chip structure 180) and the wiring substrate 190, in accordance with some embodiments.

The anchor structure 220 is thicker than the adhesive layer 240, in accordance with some embodiments. That is, a thickness T220 of the anchor structure 220 is greater than a thickness T240 of the adhesive layer 240, in accordance with some embodiments. The thickness T220 ranges from about 100 μm to about 500 μm, in accordance with some embodiments. The thickness T240 ranges from about 1 μm to about 100 μm, in accordance with some embodiments. The thickness T240 is substantially equal to a stand-off height of the antiwarpage structure 250, in accordance with some embodiments.

The antiwarpage structure 250 is made of a rigid material, such as metal (iron, copper, aluminum, or tungsten) or alloys thereof, in accordance with some embodiments. The rigidity of the antiwarpage structure 250 is greater than the rigidity of the wiring substrate 190, in accordance with some embodiments. The hardness of the antiwarpage structure 250 is greater than the hardness of the wiring substrate 190, in accordance with some embodiments. The conductive bumps 260 are made of a conductive material, such as a tin-based alloy, in accordance with some embodiments.

As shown in FIG. 1F, the anchor structures 220 include pillar structures, such as column-like structures or bump structures, in accordance with some embodiments. As shown in FIG. 1F-1, the anchor structures 220 are arranged in a symmetric manner, such as a line-symmetric manner, in accordance with some embodiments.

Figure 2:
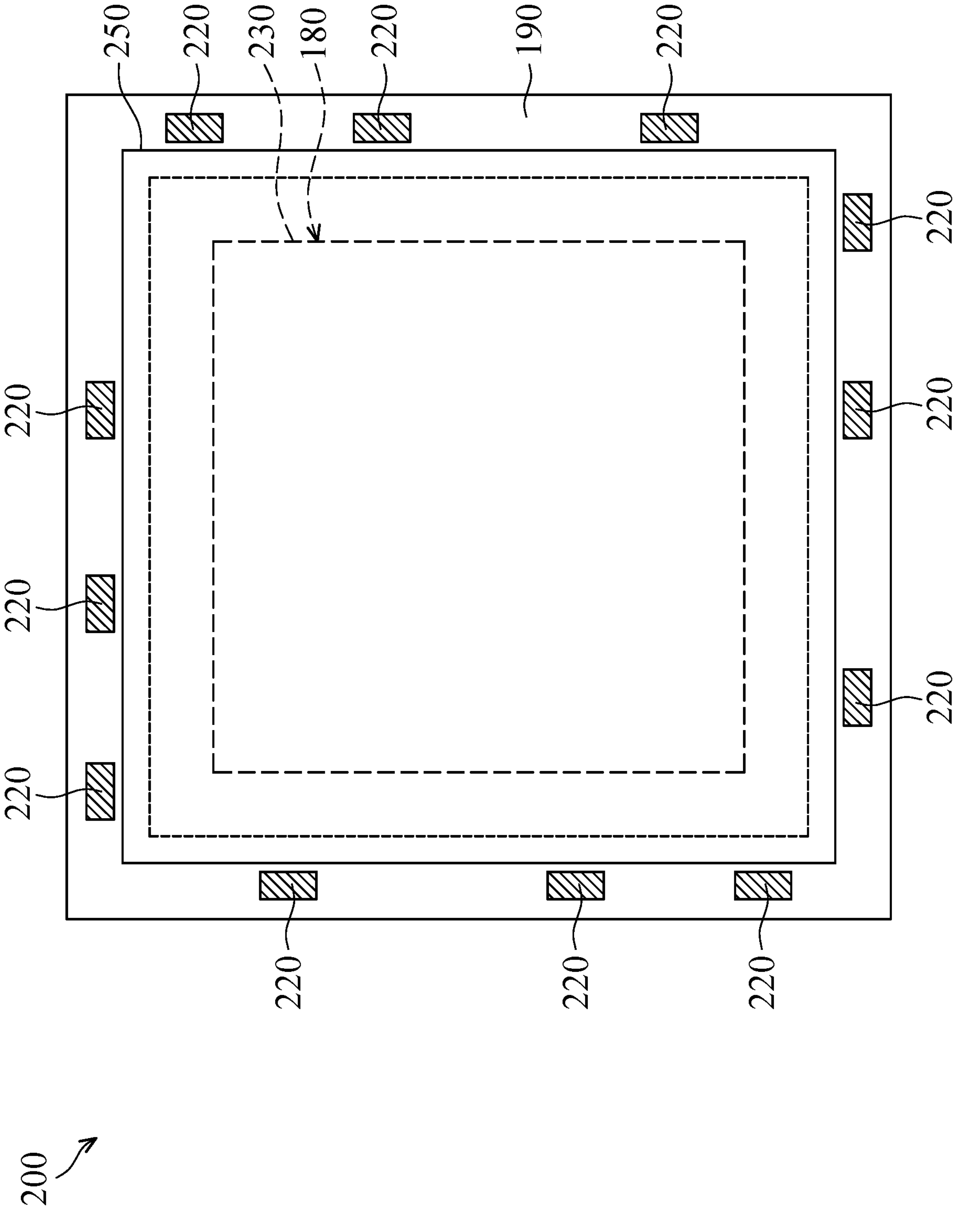
FIG. 2 is a top view of a chip package structure, in accordance with some embodiments.

FIG. 2 is a top view of a chip package structure 200, in accordance with some embodiments. As shown in FIG. 2, the chip package structure 200 is similar to the chip package structure 100 of FIG. 1F-1, except that the anchor structures 220 of the chip package structure 200 are arranged in an asymmetric manner, in accordance with some embodiments.

Figure 3:
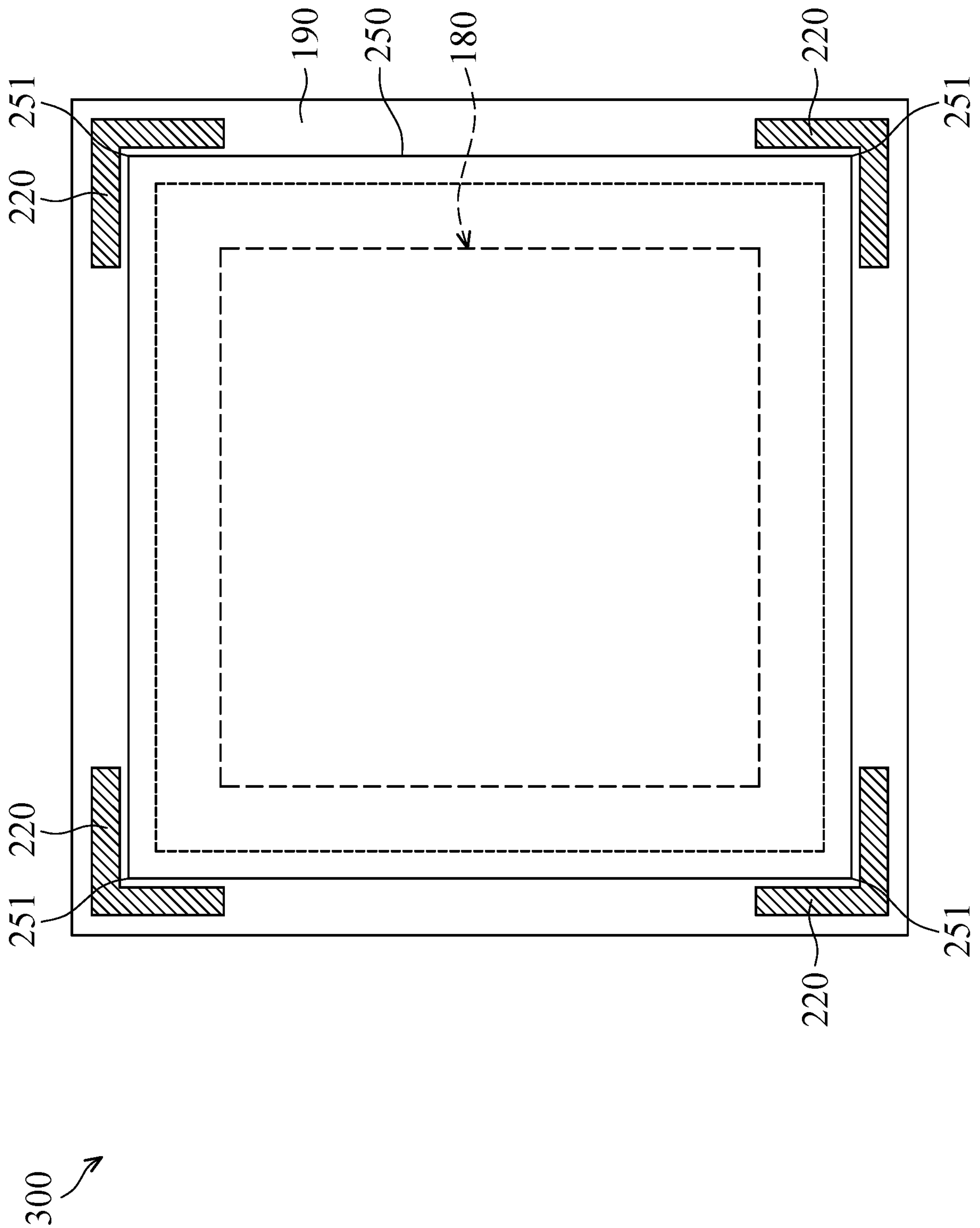
FIG. 3 is a top view of a chip package structure, in accordance with some embodiments.

FIG. 3 is a top view of a chip package structure 300, in accordance with some embodiments. As shown in FIG. 3, the chip package structure 300 is similar to the chip package structure 100 of FIG. 1F-1, except that the anchor structures 220 of the chip package structure 300 are strip structures, in accordance with some embodiments.

The strip structures have an L shape, in accordance with some embodiments. Each anchor structure 220 is adjacent to the corresponding corner 251 of the antiwarpage structure 250, in accordance with some embodiments. Each anchor structure 220 surrounds the corresponding corner 251, in accordance with some embodiments. In some other embodiments, the strip structures have I shape or another suitable shape, in accordance with some embodiments.

Figure 4:
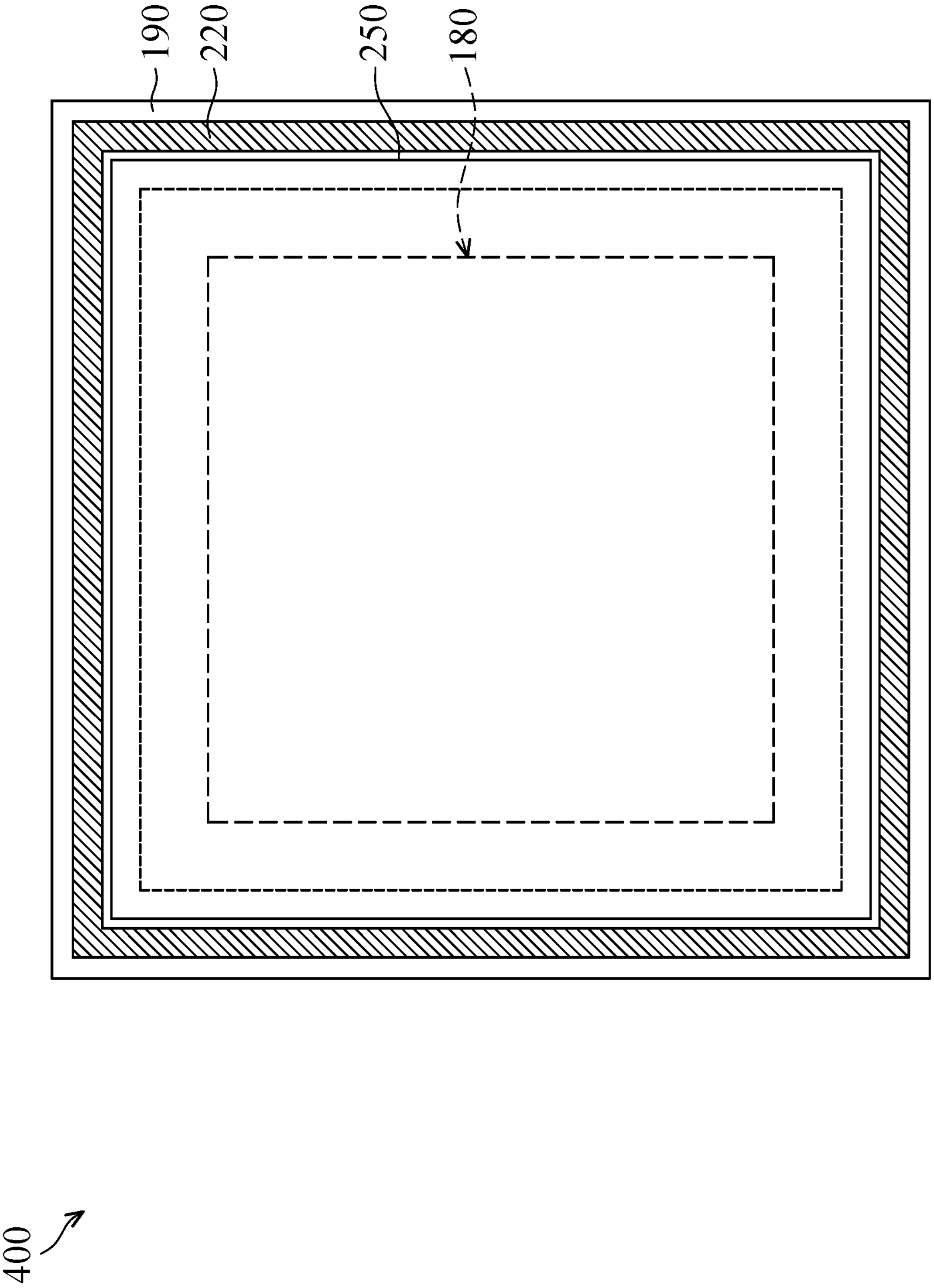
FIG. 4 is a top view of a chip package structure, in accordance with some embodiments.

FIG. 4 is a top view of a chip package structure 400, in accordance with some embodiments. As shown in FIG. 4, the chip package structure 400 is similar to the chip package structure 100 of FIG. 1F-1, except that the anchor structure 220 of the chip package structure 400 is a ring structure, in accordance with some embodiments. The anchor structure 220 continuously surrounds the entire chip structure 180 and the entire antiwarpage structure 250, in accordance with some embodiments.

Figure 5A:
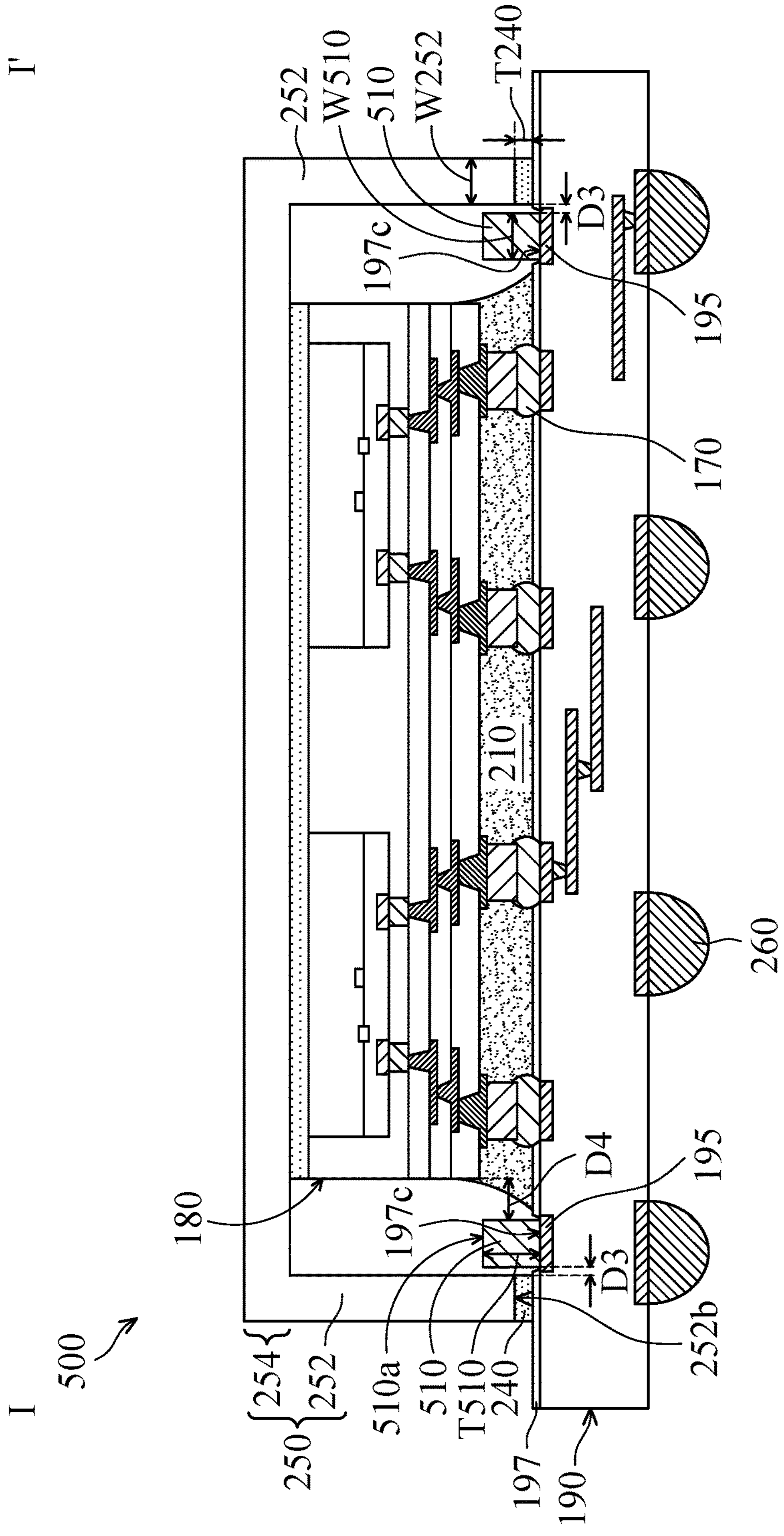
FIG. 5A is a cross-sectional view of a chip package structure, in accordance with some embodiments.
Figure 5B:
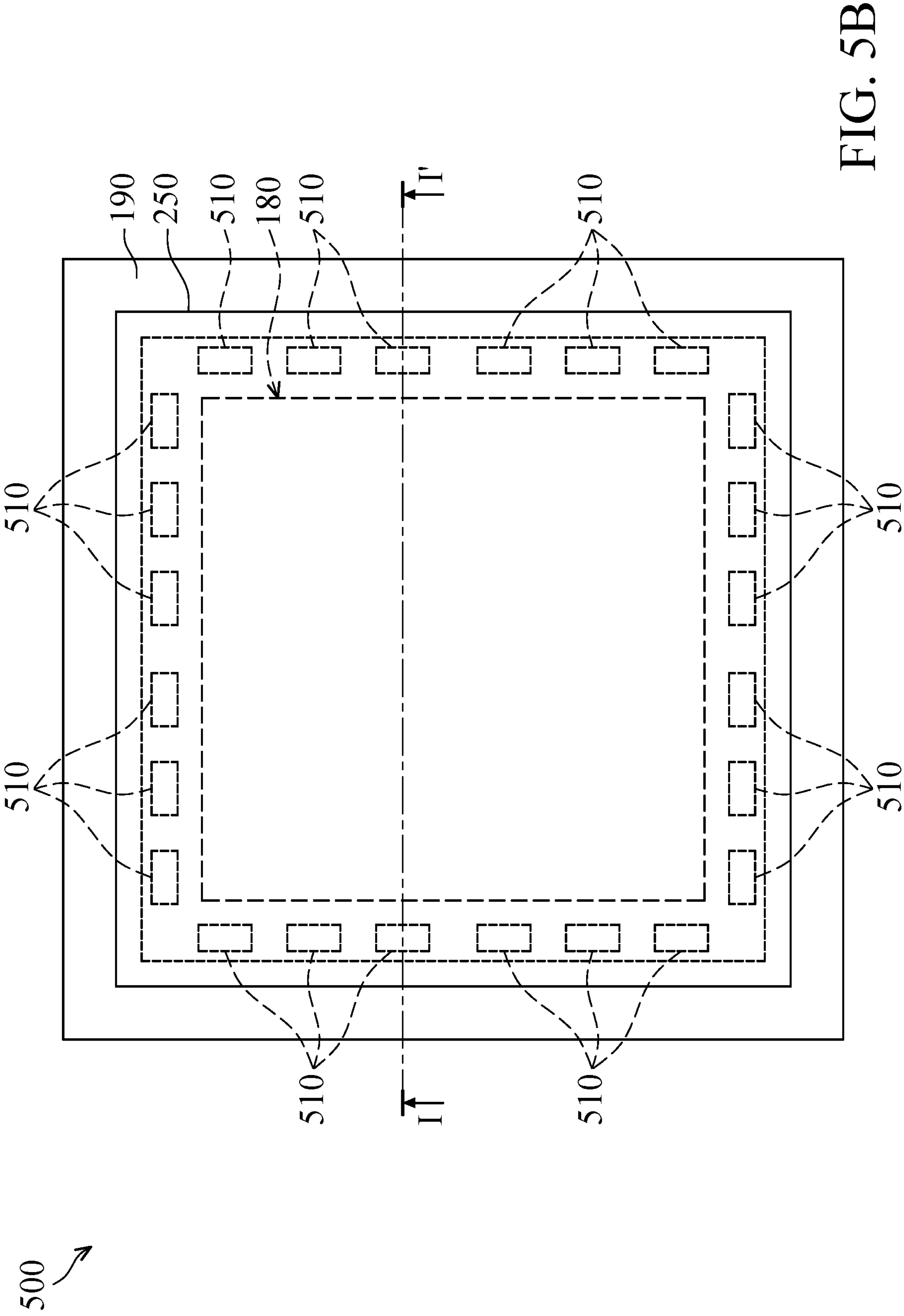
FIG. 5B is a top view of the chip package structure of FIG. 5A, in accordance with some embodiments.

FIG. 5A is a cross-sectional view of a chip package structure 500, in accordance with some embodiments. FIG. 5B is a top view of the chip package structure 500 of FIG. 5A, in accordance with some embodiments. FIG. 5A is a cross-sectional view illustrating the chip package structure 500 along a sectional line I-I' in FIG. 5B, in accordance with some embodiments.

As shown in FIGS. 5A and 5B, the chip package structure 500 is similar to the chip package structure 100 of FIG. 1F-1, except that the chip package structure 500 does not include the anchor structure 220 of the chip package structure 100, and the chip package structure 500 includes anchor structures 510, in accordance with some embodiments.

The anchor structures 510 are formed over the respective conductive pads 195 of the wiring substrate 190, in accordance with some embodiments. The anchor structures 510 are affixed to the conductive pads 195, in accordance with some embodiments. The anchor structures 510 are in the respective openings 197*c* of the insulating layer 197, in accordance with some embodiments.

The anchor structures 510 and the conductive pads 195 are electrically isolated from the chip structure 180, in accordance with some embodiments. The anchor structures 510 are between the chip structure 180 and the lower portion 252 of the antiwarpage structure 250, in accordance with some embodiments.

The anchor structures 510 are used as bonding guide structures to align the lower portion 252 with the adhesive layer 240 during bonding the lower portion 252 to the adhesive layer 240, in accordance with some embodiments. Therefore, the bonding accuracy between the lower portion 252 and the adhesive layer 240 is improved, which improves the adhesion between the antiwarpage structure 250 and the wiring substrate 190 and therefore reduces the warpage of the wiring substrate 190, in accordance with some embodiments.

As a result, the coplanarity of the conductive bumps 260, which are formed over the wiring substrate 190, is improved, which improves the yield of the process of bonding the chip package structure 500 to a substrate or another device through the conductive bumps 260, in accordance with some embodiments.

Furthermore, the thermal stress between the solder bumps 170 and the wiring substrate 190 is decreased, which prevents the formation of cracks in the solder bumps 170, in accordance with some embodiments. As a result, the reliability of the chip package structure 500 is improved, in accordance with some embodiments.

Furthermore, the anchor structures 510 are able to limit the antiwarpage structure 250 in a predetermined region, which prevents the antiwarpage structure 250 from shifting in subsequent processes, in accordance with some embodiments. Therefore, the anchor structures 510 are able to improve the structural stability of the chip package structure 500, in accordance with some embodiments.

The lower portion 252 is closer to the anchor structures 510 than the chip structure 180, in accordance with some embodiments. That is, the distance D3 between the lower portion 252 and the anchor structure 510 is less than the distance D4 between the anchor structure 510 and the chip structure 180, in accordance with some embodiments.

The distance D3 ranges from about 0 to about 100 μm, in accordance with some embodiments. In some embodiments, the lower portion 252 is in direct contact with the anchor structures 510, in accordance with some embodiments. If the distance D3 is greater than 100 μm, the anchor structures 510 may be unable to guide the antiwarpage structure 250 in the bonding process, in accordance with some embodiments.

The distance D3 is less than or equal to the width W252 of the lower portion 252, in accordance with some embodiments. The width W252 ranges from about 400 μm to about 4000 μm, in accordance with some embodiments. The distance D3 is less than or equal to a width W510 of the anchor structure 510, in accordance with some embodiments. The width W510 ranges from about 100 μm to about 500 μm, in accordance with some embodiments.

As shown in FIG. 5A, top surfaces 510*a* of the anchor structures 510 are higher than the bottom surface 252*b* of the lower portion 252, which helps the anchor structures 510 to reduce the shift quantity of the antiwarpage structure 250, in accordance with some embodiments.

The anchor structure 510 is thicker than the adhesive layer 240, in accordance with some embodiments. That is, a thickness T510 of the anchor structure 510 is greater than a thickness T240 of the adhesive layer 240, in accordance with some embodiments. The thickness T510 ranges from about 100 μm to about 500 μm, in accordance with some embodiments. The thickness T240 ranges from about 1 μm to about 100 μm, in accordance with some embodiments.

The anchor structures 510 are made of a rigid material, such as metal (iron, copper, aluminum, or tungsten) or alloys thereof, in accordance with some embodiments. The rigidity of the anchor structures 510 is greater than the rigidity of the wiring substrate 190, in accordance with some embodiments. The hardness of the anchor structures 510 is greater than the hardness of the wiring substrate 190, in accordance with some embodiments.

The anchor structures 510 are formed using a plating process, such as an electroplating process, in accordance with some embodiments. As shown in FIG. 5B, the anchor structures 510 are arranged in a symmetric manner, such as a line-symmetric manner, in accordance with some embodiments.

Figure 6:
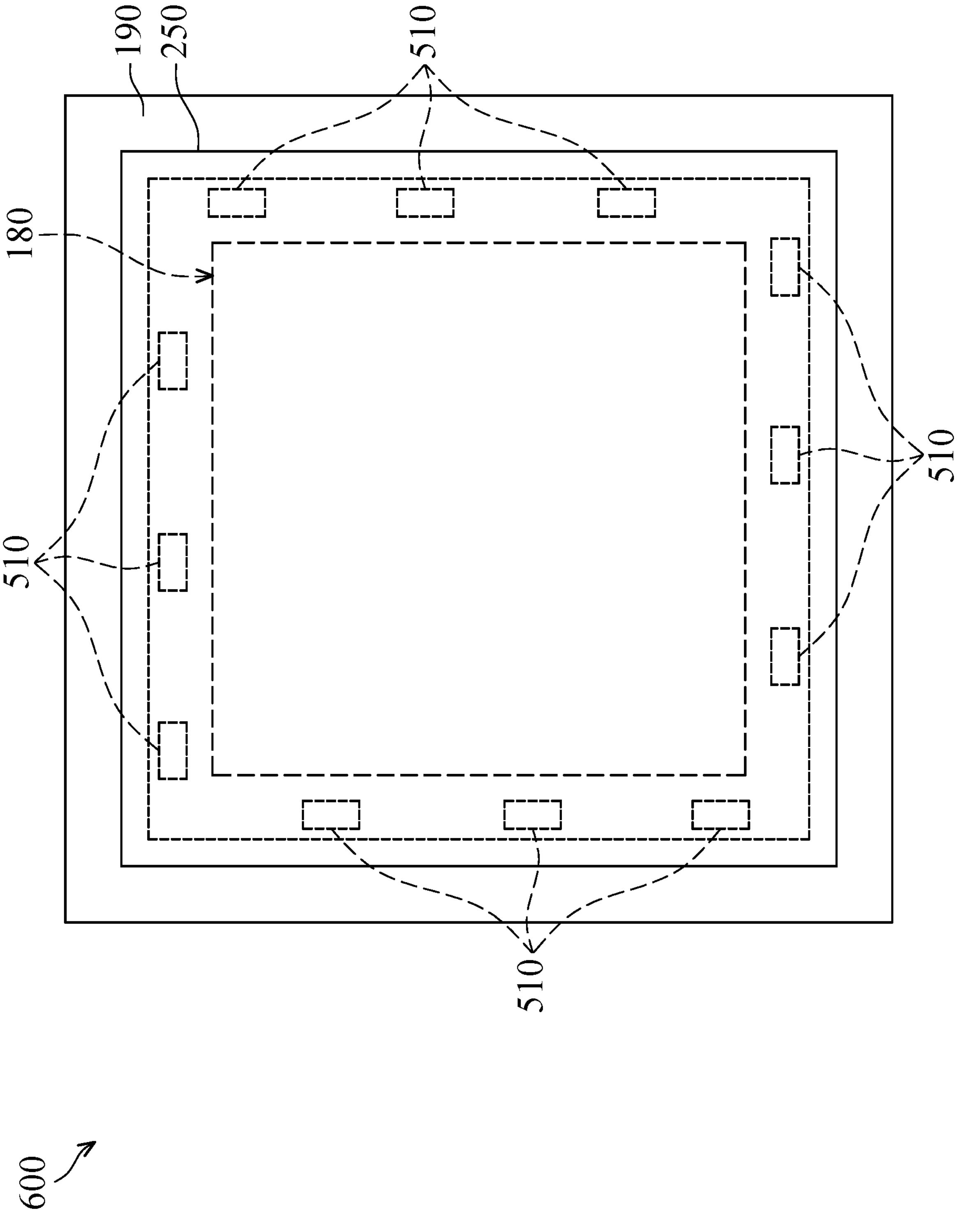
FIG. 6 is a top view of a chip package structure, in accordance with some embodiments.

FIG. 6 is a top view of a chip package structure 600, in accordance with some embodiments. As shown in FIG. 6, the chip package structure 600 is similar to the chip package structure 500 of FIG. 5B, except that the anchor structures 510 of the chip package structure 600 are arranged in an asymmetric manner, in accordance with some embodiments.

Figure 7:
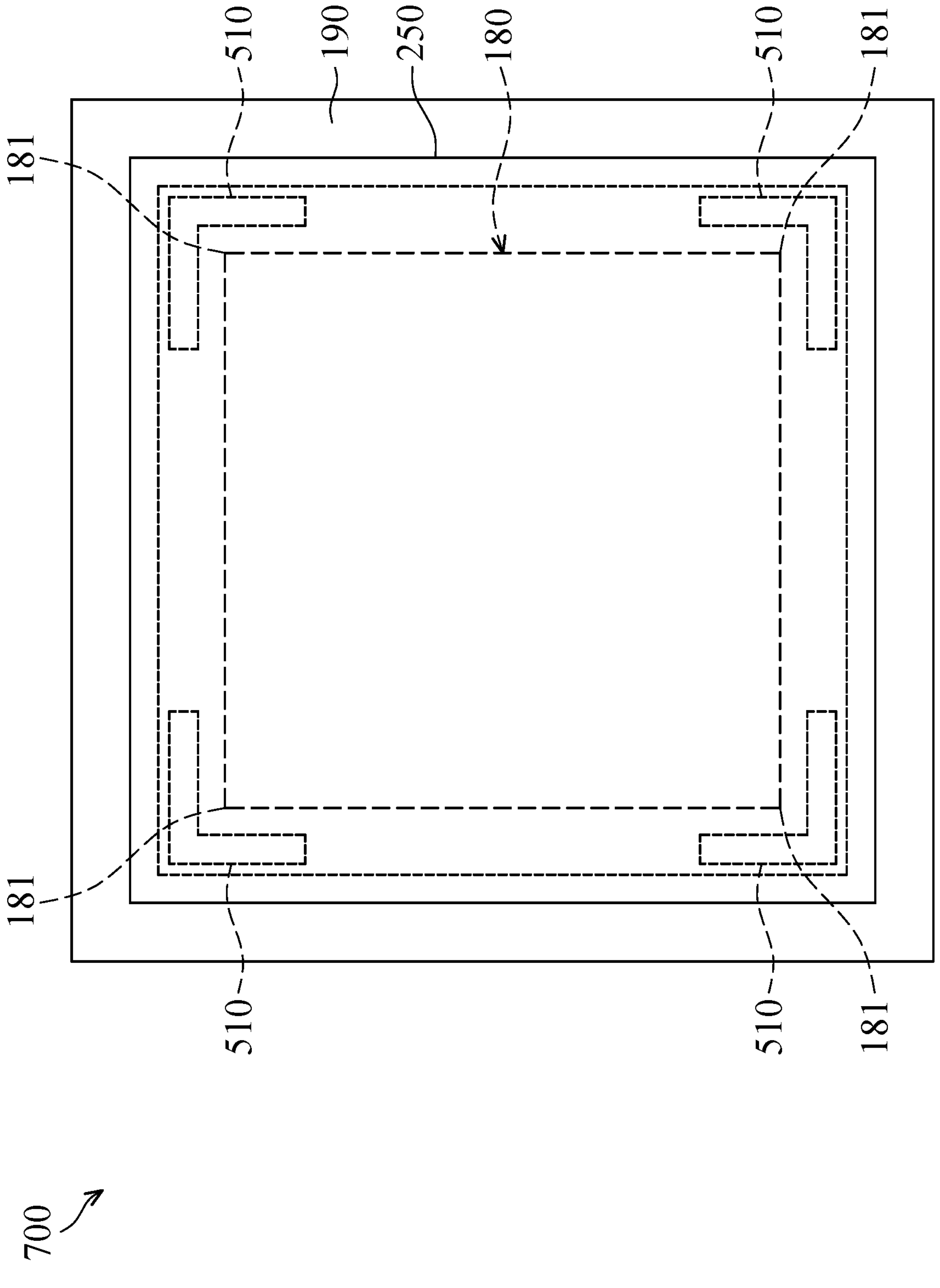
FIG. 7 is a top view of a chip package structure, in accordance with some embodiments.

FIG. 7 is a top view of a chip package structure 700, in accordance with some embodiments. As shown in FIG. 7, the chip package structure 700 is similar to the chip package structure 500 of FIG. 5B, except that the anchor structures 510 of the chip package structure 700 are strip structures, in accordance with some embodiments.

The strip structures have an L shape, in accordance with some embodiments. Each anchor structure 510 is adjacent to the corresponding corner 181 of the chip structure 180, in accordance with some embodiments. Each anchor structure 510 surrounds the corresponding corner 181, in accordance with some embodiments. In some other embodiments, the strip structures have an I shape or another suitable shape, in accordance with some embodiments.

Figure 8:
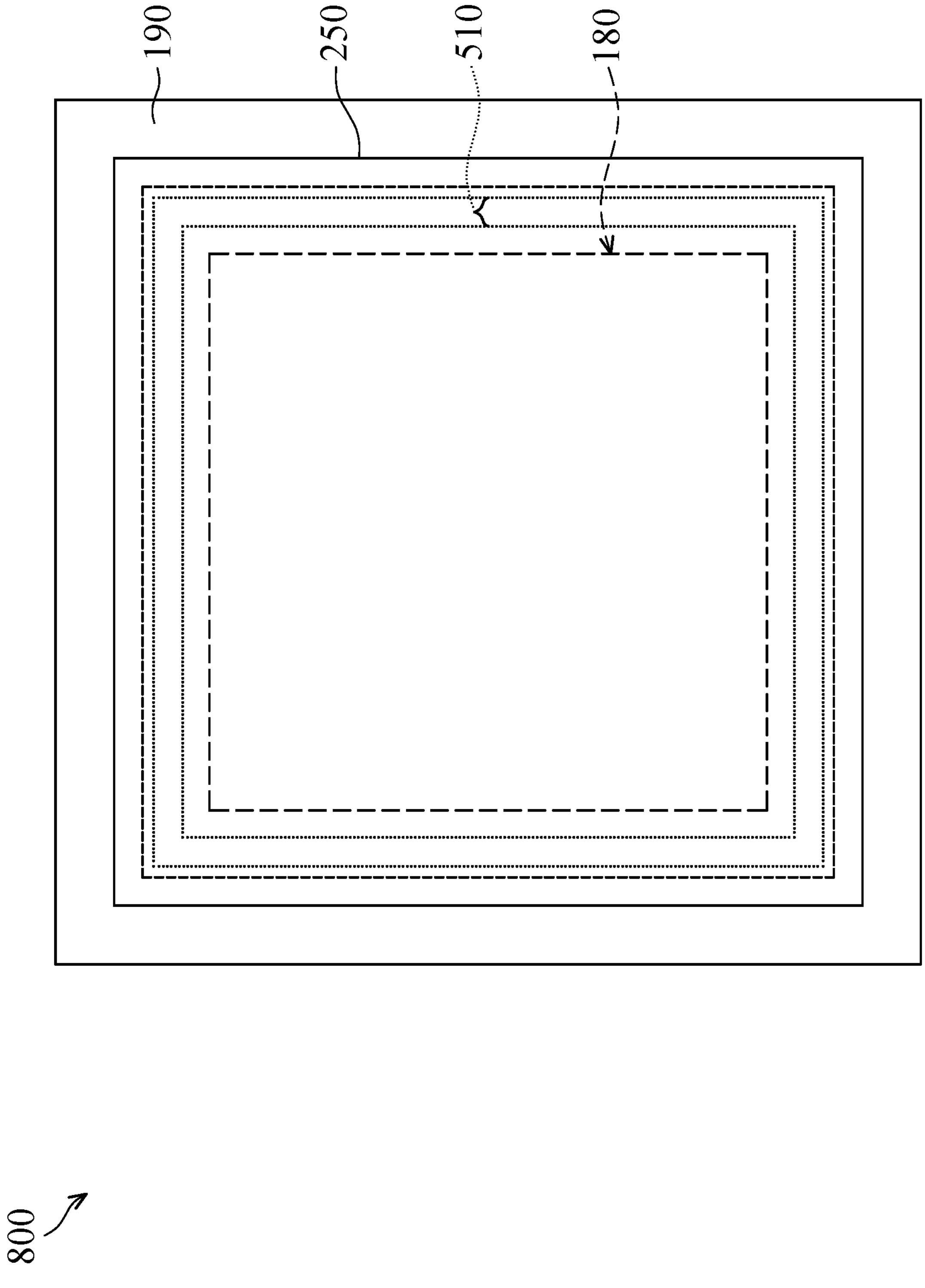
FIG. 8 is a top view of a chip package structure, in accordance with some embodiments.

FIG. 8 is a top view of a chip package structure 800, in accordance with some embodiments. As shown in FIG. 8, the chip package structure 800 is similar to the chip package structure 500 of FIG. 5B, except that the anchor structure 510 of the chip package structure 800 is a ring structure, in accordance with some embodiments.

The anchor structure 510 continuously surrounds the entire chip structure 180, in accordance with some embodiments. The antiwarpage structure 250 covers the entire chip structure 180 and the entire anchor structure 510, in accordance with some embodiments.

Figure 9A:
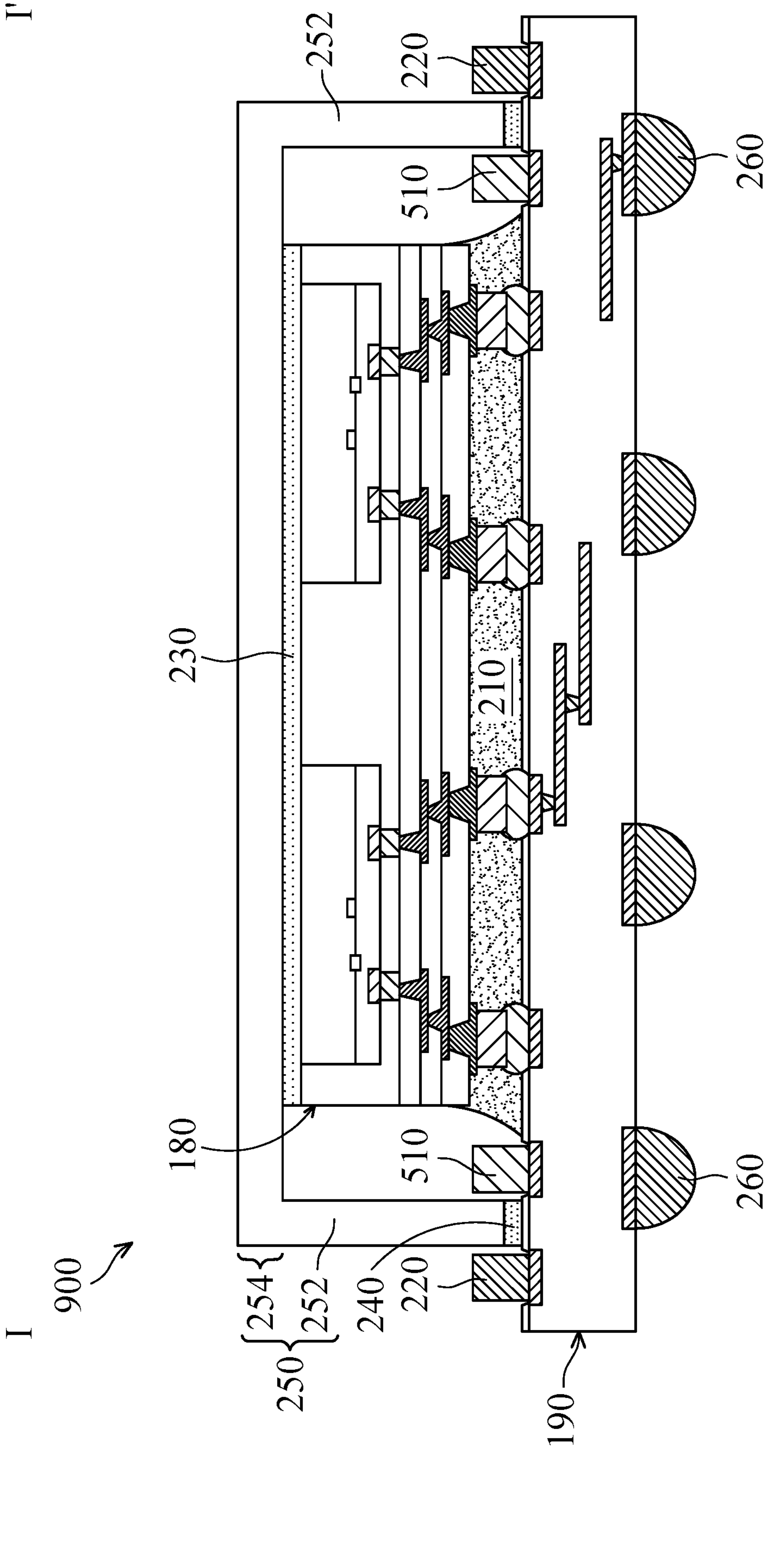
FIG. 9A is a cross-sectional view of a chip package structure, in accordance with some embodiments.
Figure 9B:
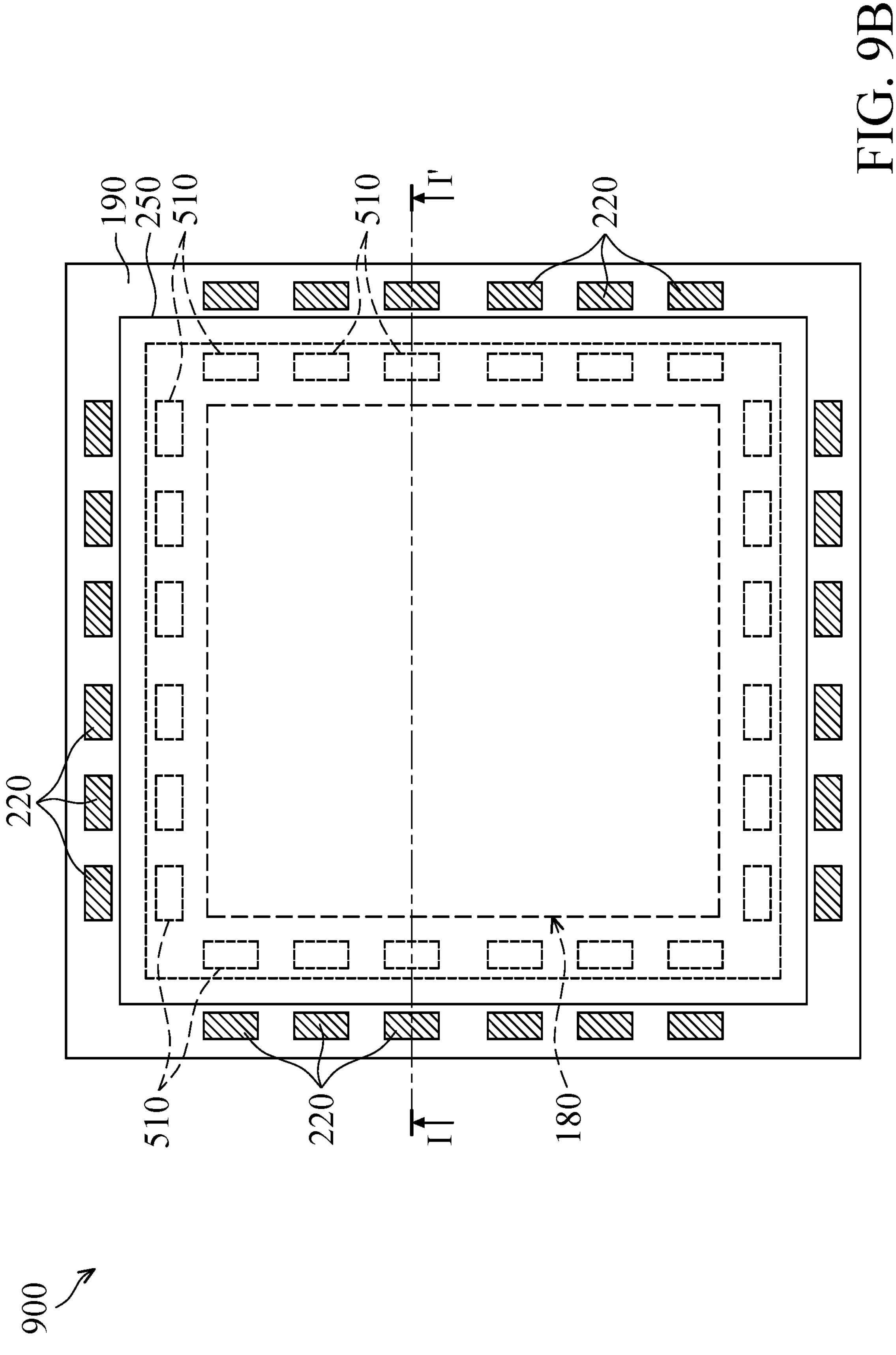
FIG. 9B is a top view of the chip package structure of FIG. 9A, in accordance with some embodiments.

FIG. 9A is a cross-sectional view of a chip package structure 900, in accordance with some embodiments. FIG. 9B is a top view of the chip package structure 900 of FIG. 9A, in accordance with some embodiments. FIG. 9A is a cross-sectional view illustrating the chip package structure 900 along a sectional line I-I' in FIG. 9B, in accordance with some embodiments.

As shown in FIGS. 9A and 9B, the chip package structure 900 is similar to the chip package structure 100 of FIG. 1F-1 and the chip package structure 500 of FIG. 5B, except that the chip package structure 900 includes both of the anchor structures 220 of the chip package structure 100 and the anchor structures 510 of the chip package structure 500, in accordance with some embodiments. As shown in FIG. 9B, the anchor structures 220 and 510 are arranged in a symmetric manner, such as a line-symmetric manner, in accordance with some embodiments.

Figure 10:
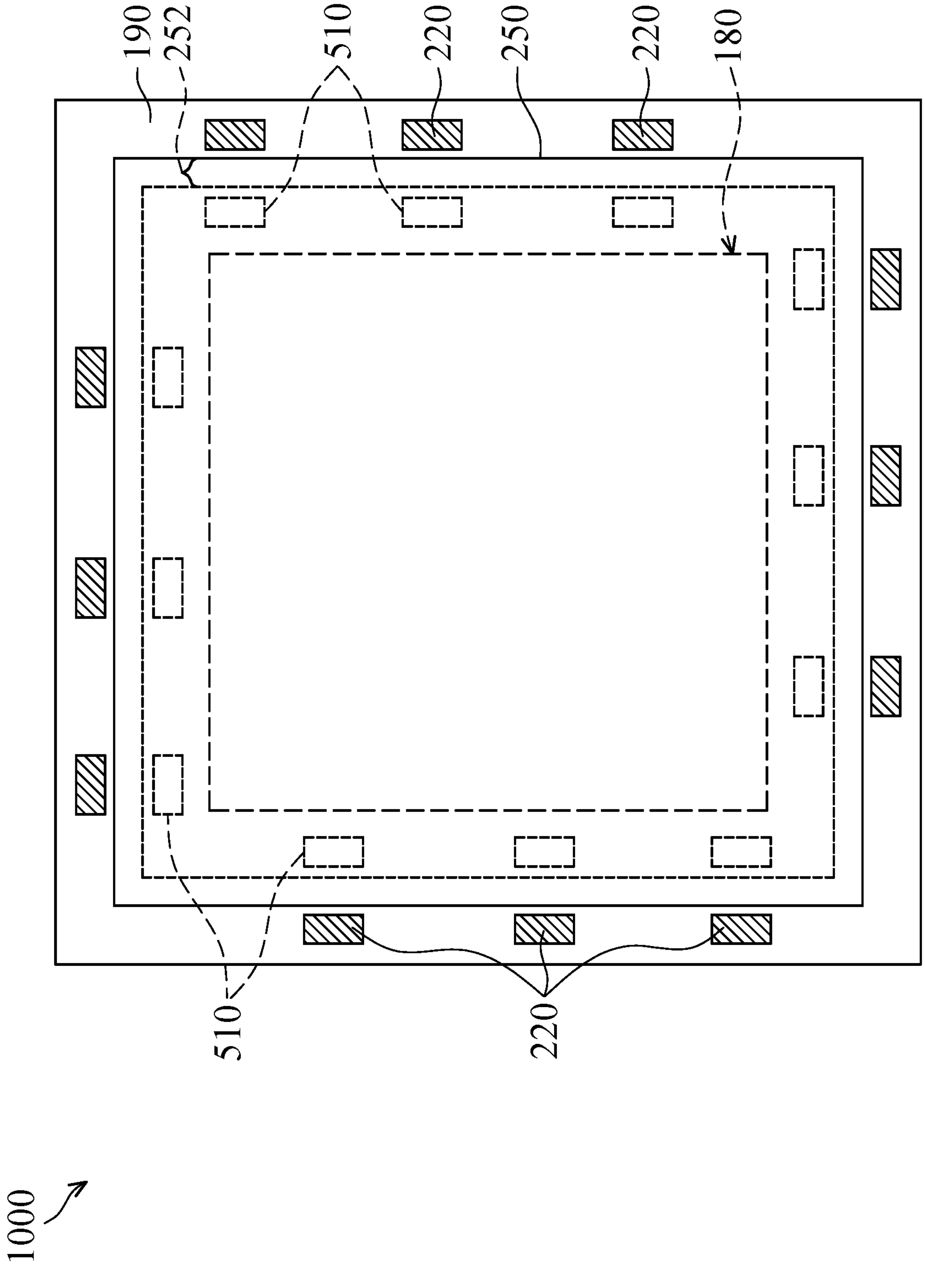
FIG. 10 is a top view of a chip package structure, in accordance with some embodiments.

FIG. 10 is a top view of a chip package structure 1000, in accordance with some embodiments. As shown in FIG. 10, the chip package structure 1000 is similar to the chip package structure 900 of FIG. 9B, except that the anchor structures 220 of the chip package structure 1000 are arranged in an asymmetric manner, and the anchor structures 510 of the chip package structure 1000 are arranged in an asymmetric manner, in accordance with some embodiments.

The anchor structure 220 and the adjacent anchor structure 510 are arranged in a symmetric manner, such as a line-symmetric manner, with respect to the lower portion 252 of the antiwarpage structure 250 therebetween, in accordance with some embodiments.

Figure 11:
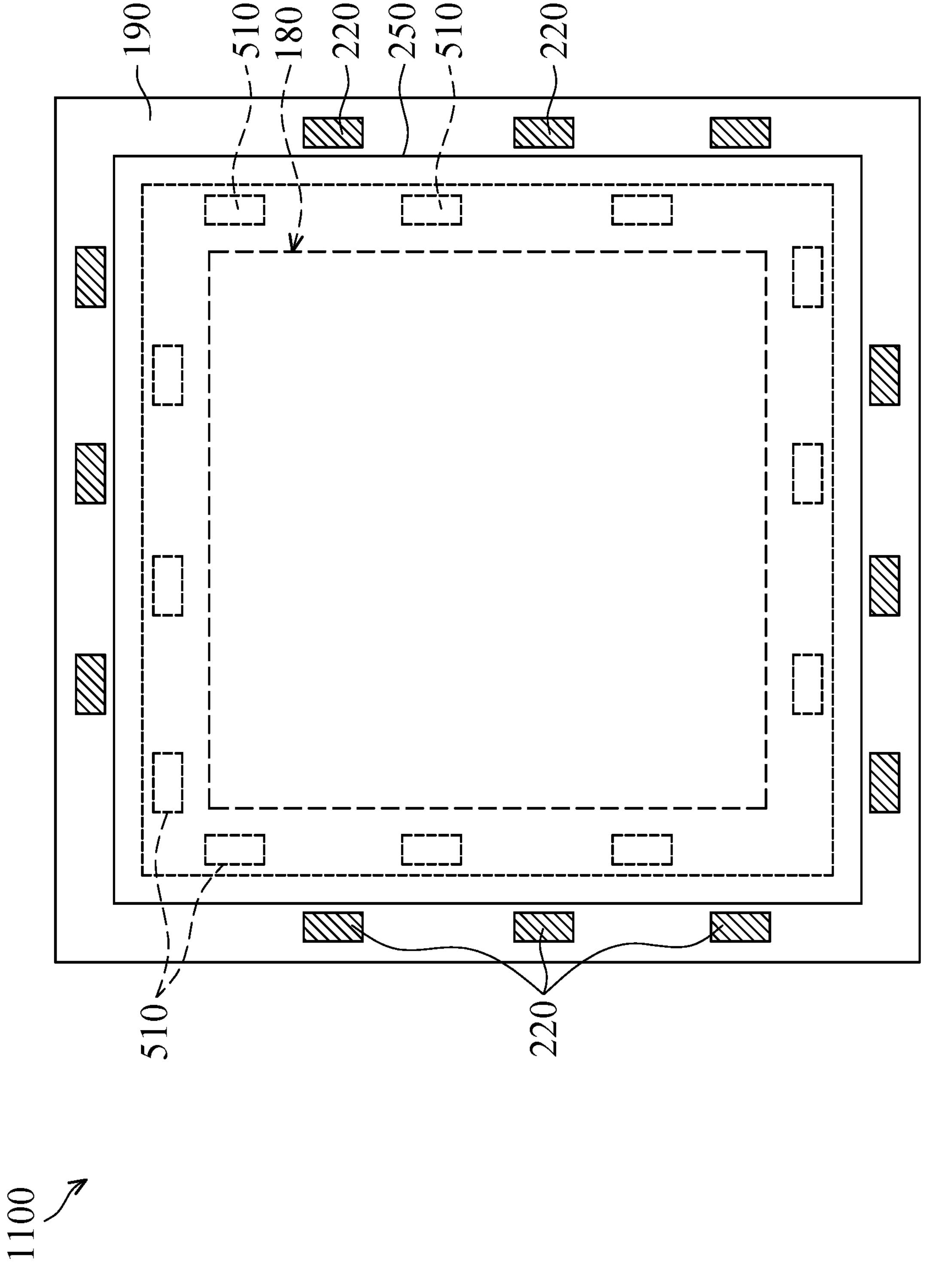
FIG. 11 is a top view of a chip package structure, in accordance with some embodiments.

FIG. 11 is a top view of a chip package structure 1100, in accordance with some embodiments. As shown in FIG. 11, the chip package structure 1100 is similar to the chip package structure 900 of FIG. 9B, except that the anchor structures 220 of the chip package structure 1100 are arranged in an asymmetric manner, and the anchor structures 510 of the chip package structure 1100 are arranged in an asymmetric manner, in accordance with some embodiments. The anchor structure 220 and the adjacent anchor structure 510 are arranged in an asymmetric manner, in accordance with some embodiments.

Figure 12:
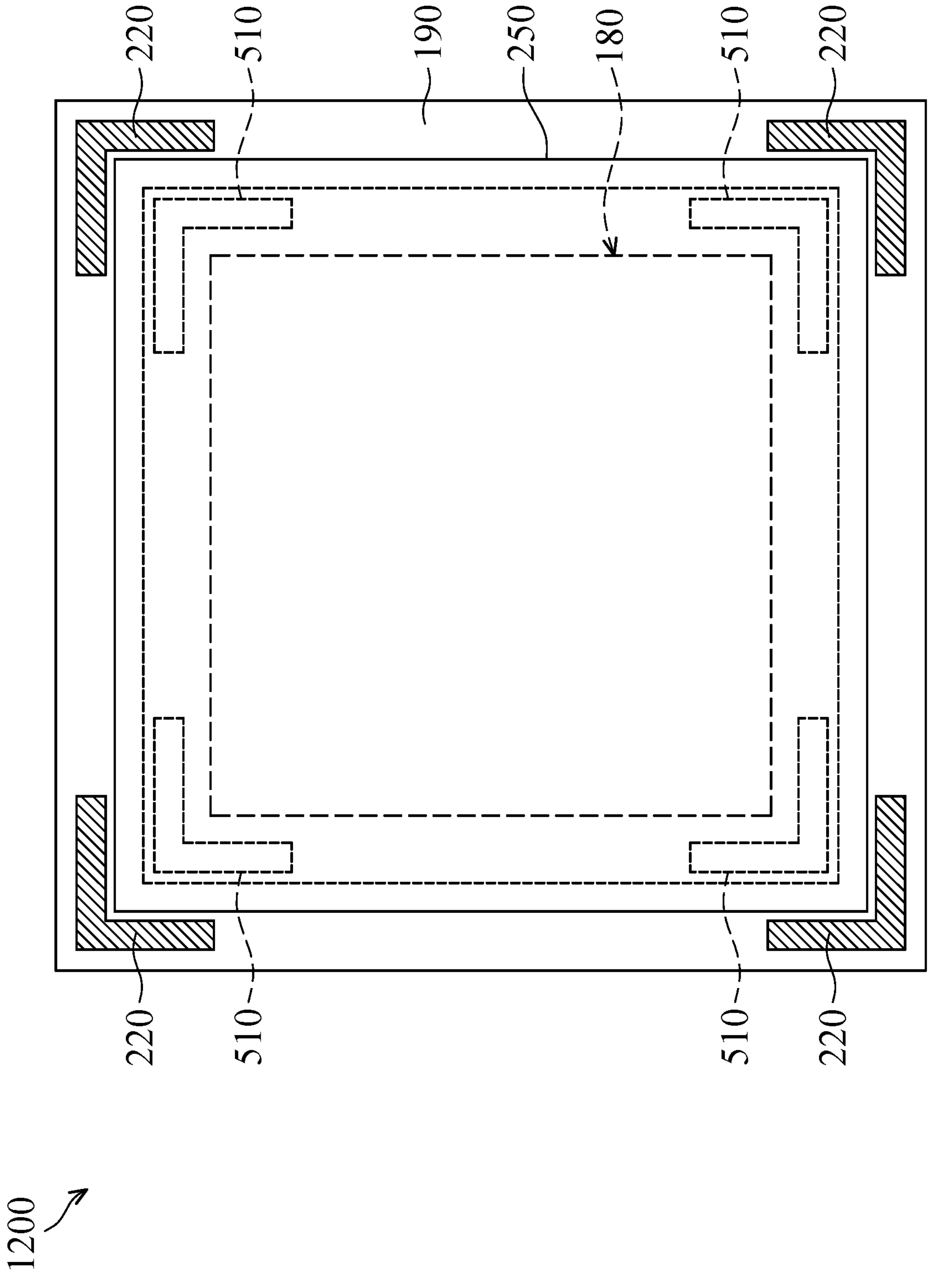
FIG. 12 is a top view of a chip package structure, in accordance with some embodiments.

FIG. 12 is a top view of a chip package structure 1200, in accordance with some embodiments. As shown in FIG. 12, the chip package structure 1200 is similar to the chip package structure 300 of FIG. 3 and the chip package structure 700 of FIG. 7, except that the chip package structure 1200 includes both of the anchor structures 220 of the chip package structure 300 and the anchor structures 510 of the chip package structure 700, in accordance with some embodiments. The anchor structures 220 and 510 are arranged in a symmetric manner, such as a line-symmetric manner, in accordance with some embodiments.

Figure 13:
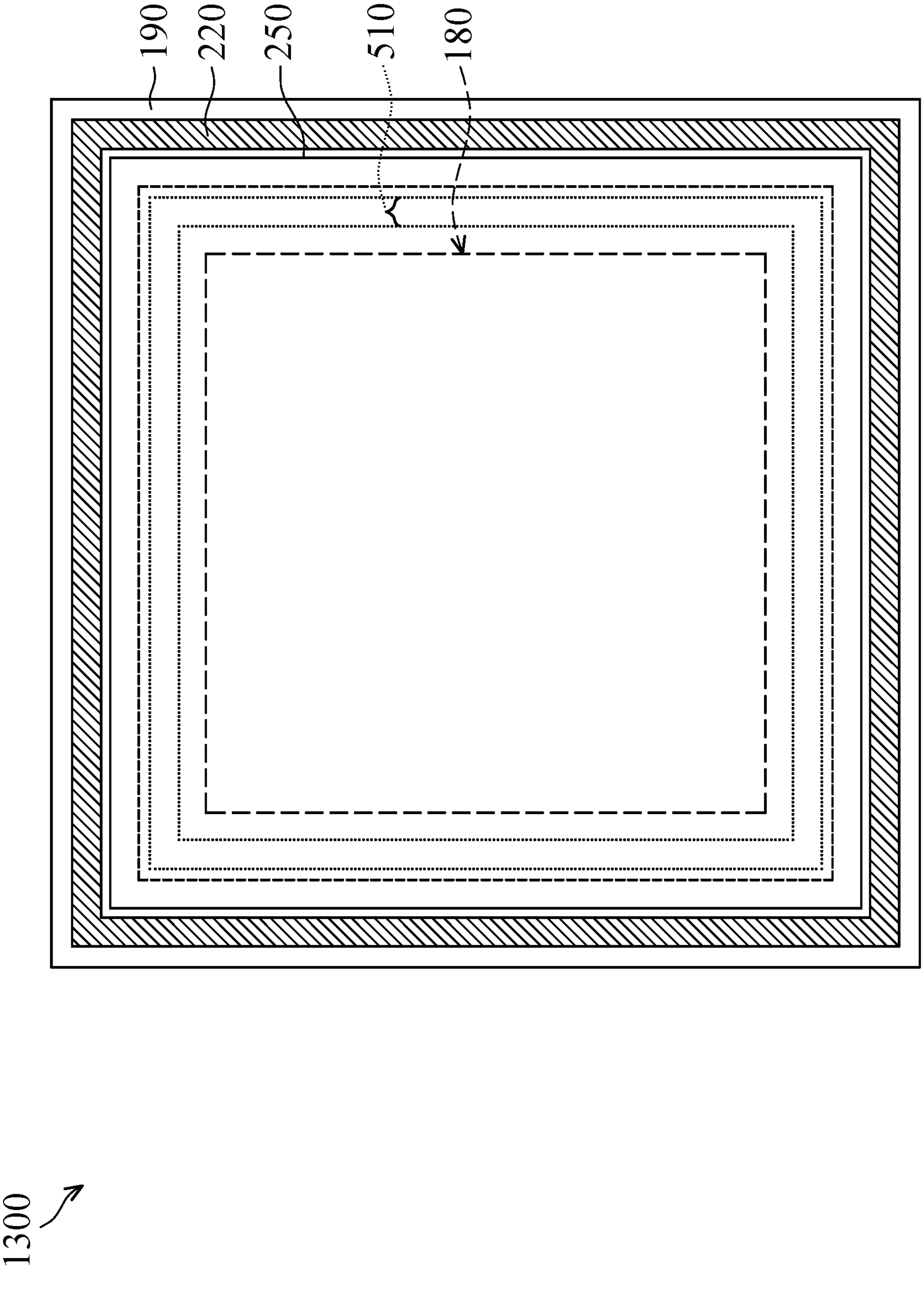
FIG. 13 is a top view of a chip package structure, in accordance with some embodiments.

FIG. 13 is a top view of a chip package structure 1300, in accordance with some embodiments. As shown in FIG. 13, the chip package structure 1300 is similar to the chip package structure 400 of FIG. 4 and the chip package structure 800 of FIG. 8, except that the chip package structure 1300 includes both of the anchor structures 220 of the chip package structure 400 and the anchor structures 510 of the chip package structure 800, in accordance with some embodiments.

Figure 14:
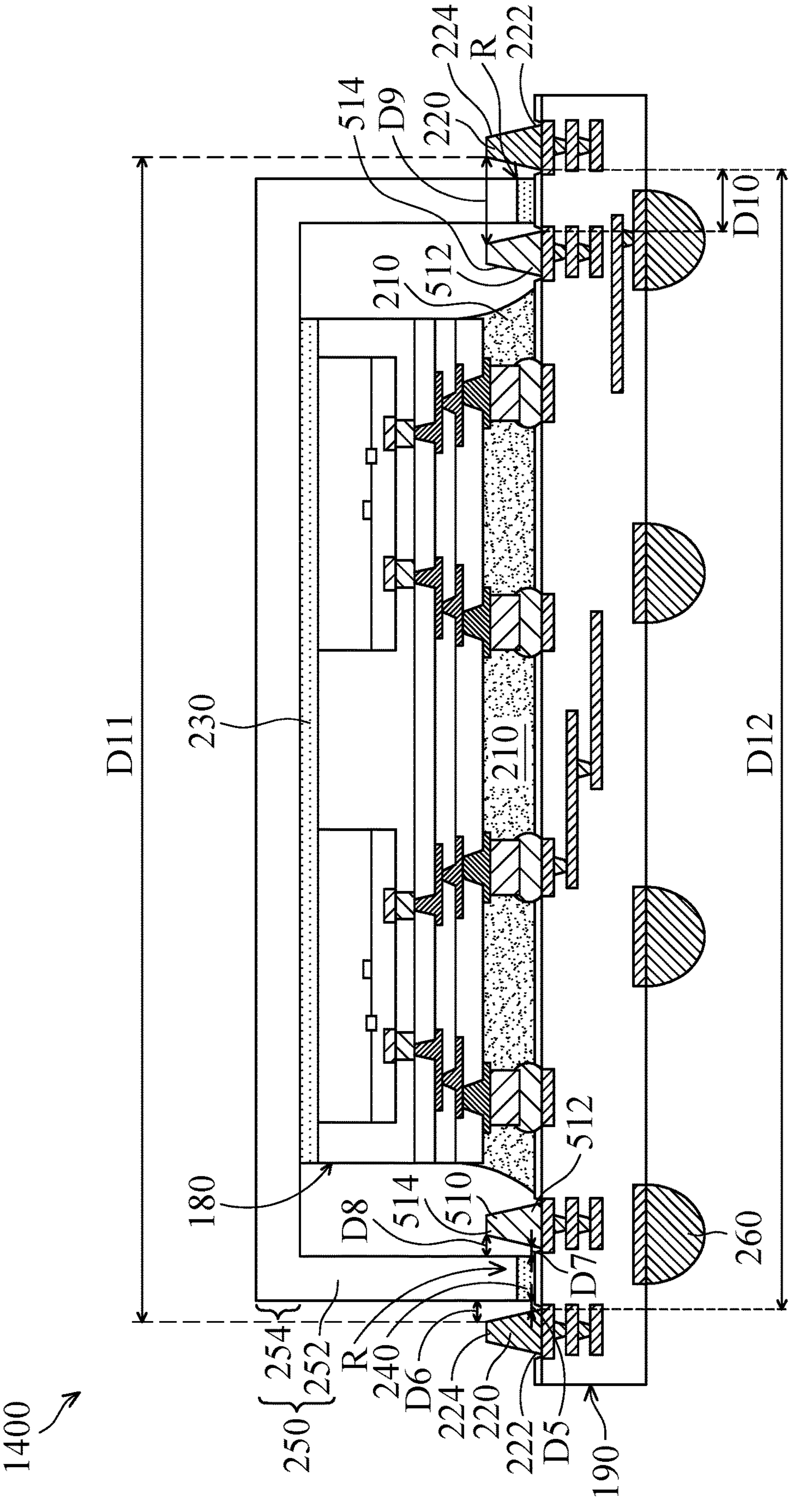
FIG. 14 is a cross-sectional view of a chip package structure, in accordance with some embodiments.

FIG. 14 is a cross-sectional view of a chip package structure 1400, in accordance with some embodiments. As shown in FIG. 14, the chip package structure 1400 is similar to the chip package structure 900 of FIG. 9A, except that a lower portion 222 of the anchor structure 220 is closer to the lower portion 252 of the antiwarpage structure 250 than an upper portion 224 of the anchor structure 220, and a lower portion 512 of the anchor structure 510 is closer to the lower portion 252 than an upper portion 514 of the anchor structure 510, in accordance with some embodiments.

That is, a distance D5 between the lower portions 222 and 252 is less than a distance D6 between the upper portion 224 and the lower portion 252, and a distance D7 between the lower portions 512 and 252 is less than a distance D8 between the upper portion 514 and the lower portion 252, in accordance with some embodiments.

In some embodiments, a distance D9 between the upper portions 224 and 514 of the anchor structures 220 and 510 is greater than a distance D10 between the lower portions 222 and 512 of the anchor structures 220 and 510. The lower portion 252 is between the anchor structures 510 and the anchor structures 220, in accordance with some embodiments.

There is a recess R surrounded by the anchor structure 220 and the adjacent anchor structure 510 and the wiring substrate 190, and the lower portion 252 is in the recess R, in accordance with some embodiments. The distance D9 is greater than the distance D10, which helps the lower portion 252 of the antiwarpage structure 250 to be disposed into the recess R and to be aligned with the adhesive layer 240, in accordance with some embodiments.

The distance D9 ranges from about 500 μm to about 4000 μm, in accordance with some embodiments. The distance D10 ranges from about 450 μm to about 2600 μm, in accordance with some embodiments. In some embodiments, a ratio of the distance D9 to the distance D10 is greater than 1 and less than or equal to 1.5.

In some embodiments, a distance D11 between the upper portions 224 of the anchor structures 220 is greater than a distance D12 between the lower portions 222 of the anchor structures 220. The distance D11 ranges from about 1 mm to about 110 mm, in accordance with some embodiments. The distance D12 ranges from about 1 mm to about 70 mm, in accordance with some embodiments. In some embodiments, a ratio of the distance D11 to the distance D12 is greater than 1 and less than or equal to 1.5.

As shown in FIG. 14, the upper portion 224 of the anchor structure 220 is narrower than the lower portion 222 of the anchor structure 220, and the upper portion 514 of the anchor structure 510 is narrower than the lower portion 512 of the anchor structure 510, in accordance with some embodiments.

The anchor structure 220 has a nail-like shape or a trapezoid shape, such as an isosceles trapezoid shape, in accordance with some embodiments. The anchor structure 510 has a nail-like shape or a trapezoid shape, such as an isosceles trapezoid shape, in accordance with some embodiments.

Figure 15:
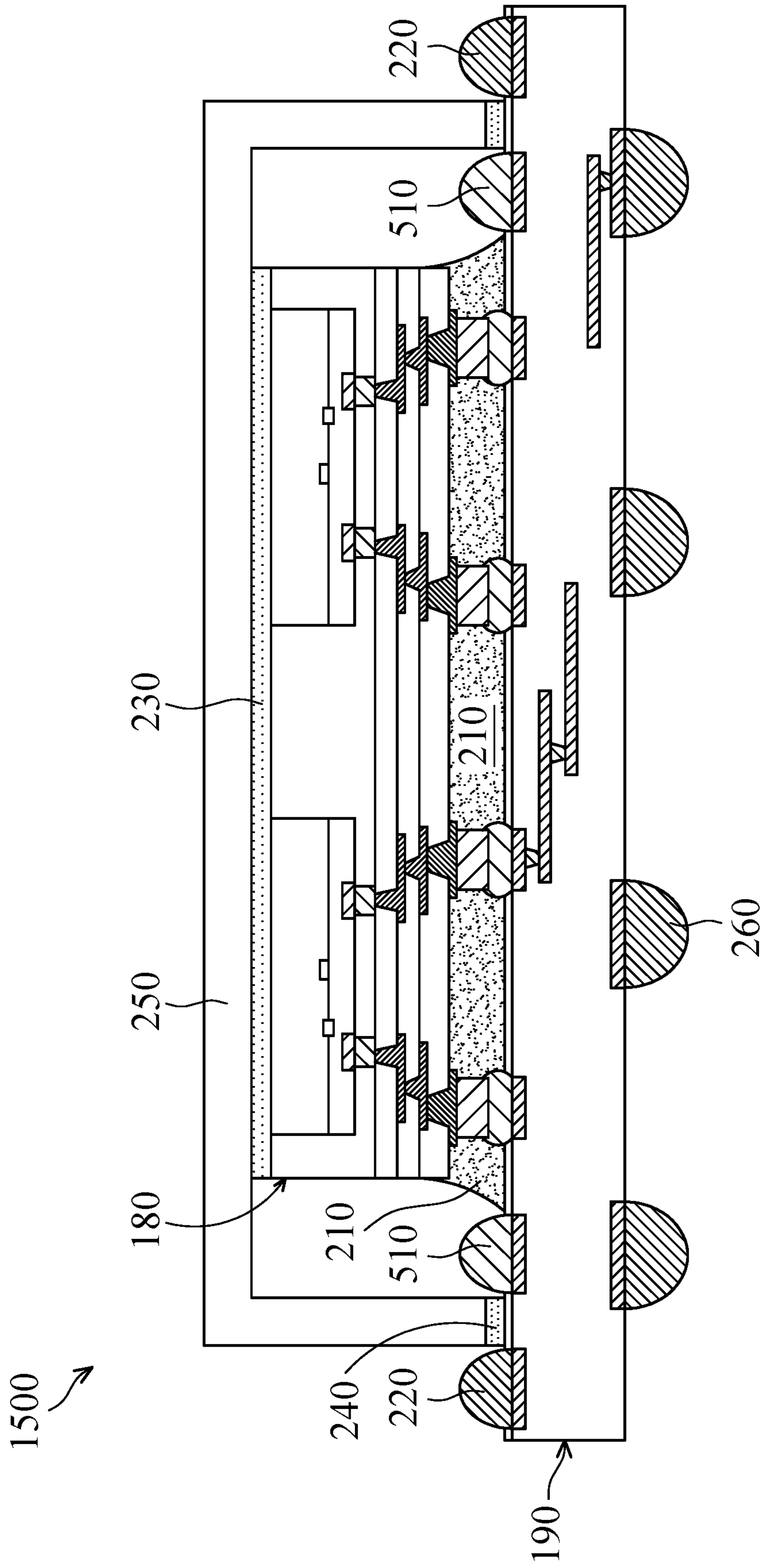
FIG. 15 is a cross-sectional view of a chip package structure, in accordance with some embodiments.

FIG. 15 is a cross-sectional view of a chip package structure 1500, in accordance with some embodiments. As shown in FIG. 15, the chip package structure 1500 is similar to the chip package structure 1400 of FIG. 14, except that the anchor structures 220 and 510 of the chip package structure 1500 have a semicircle-like shape, in accordance with some embodiments. The anchor structures 220 and 510 are made of a conductive material, such as a tin-based alloy, in accordance with some embodiments. The anchor structures 220 and 510 are solder bumps, in accordance with some embodiments.

Figure 16:
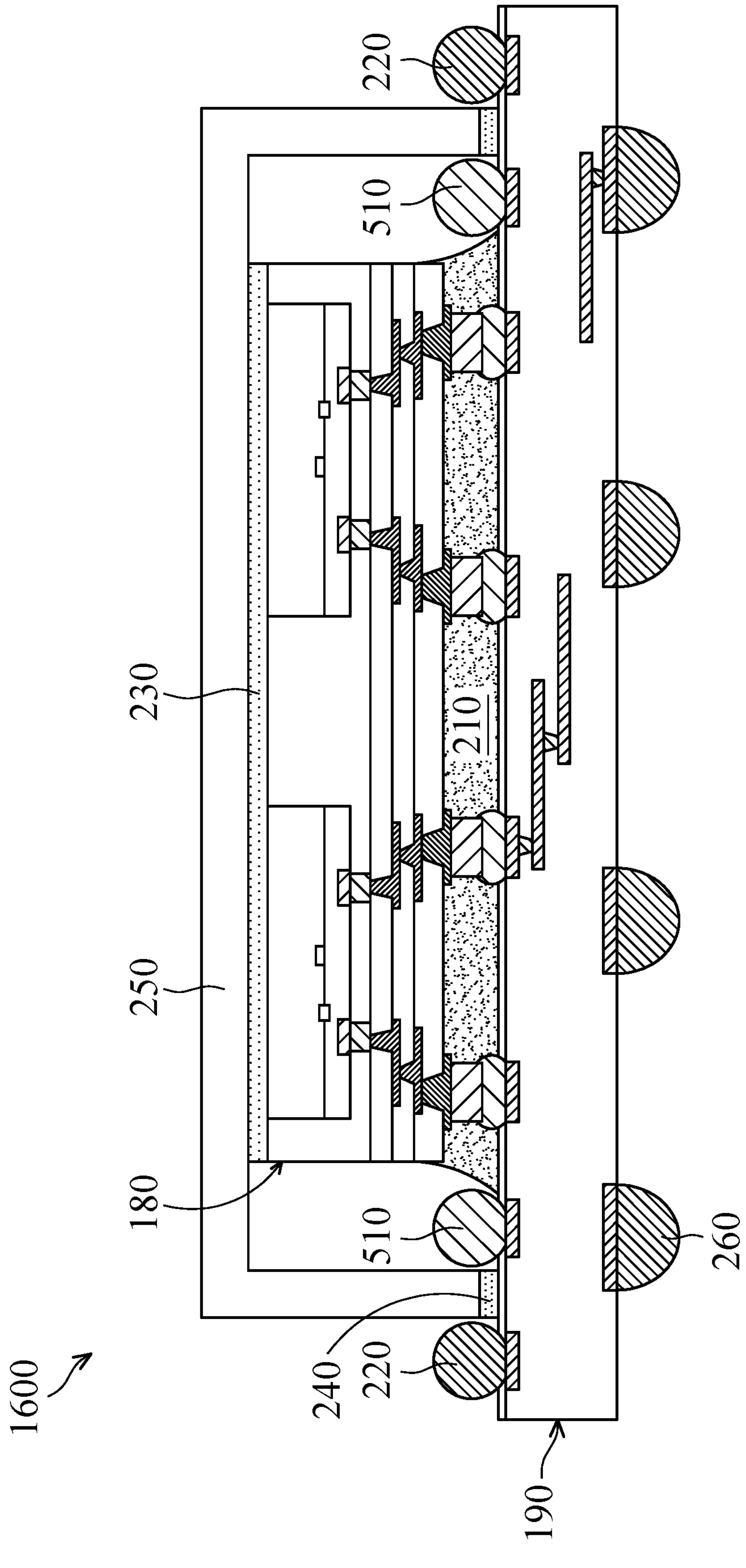
FIG. 16 is a cross-sectional view of a chip package structure, in accordance with some embodiments.

FIG. 16 is a cross-sectional view of a chip package structure 1600, in accordance with some embodiments. As shown in FIG. 16, the chip package structure 1600 is similar to the chip package structure 1400 of FIG. 14, except that the anchor structures 220 and 510 of the chip package structure 1600 have a circle-like shape (or a ball-like shape), in accordance with some embodiments. The anchor structures 220 and 510 are made of a conductive material, such as a tin-based alloy, in accordance with some embodiments. The anchor structures 220 and 510 are solder balls, in accordance with some embodiments.

Figure 17:
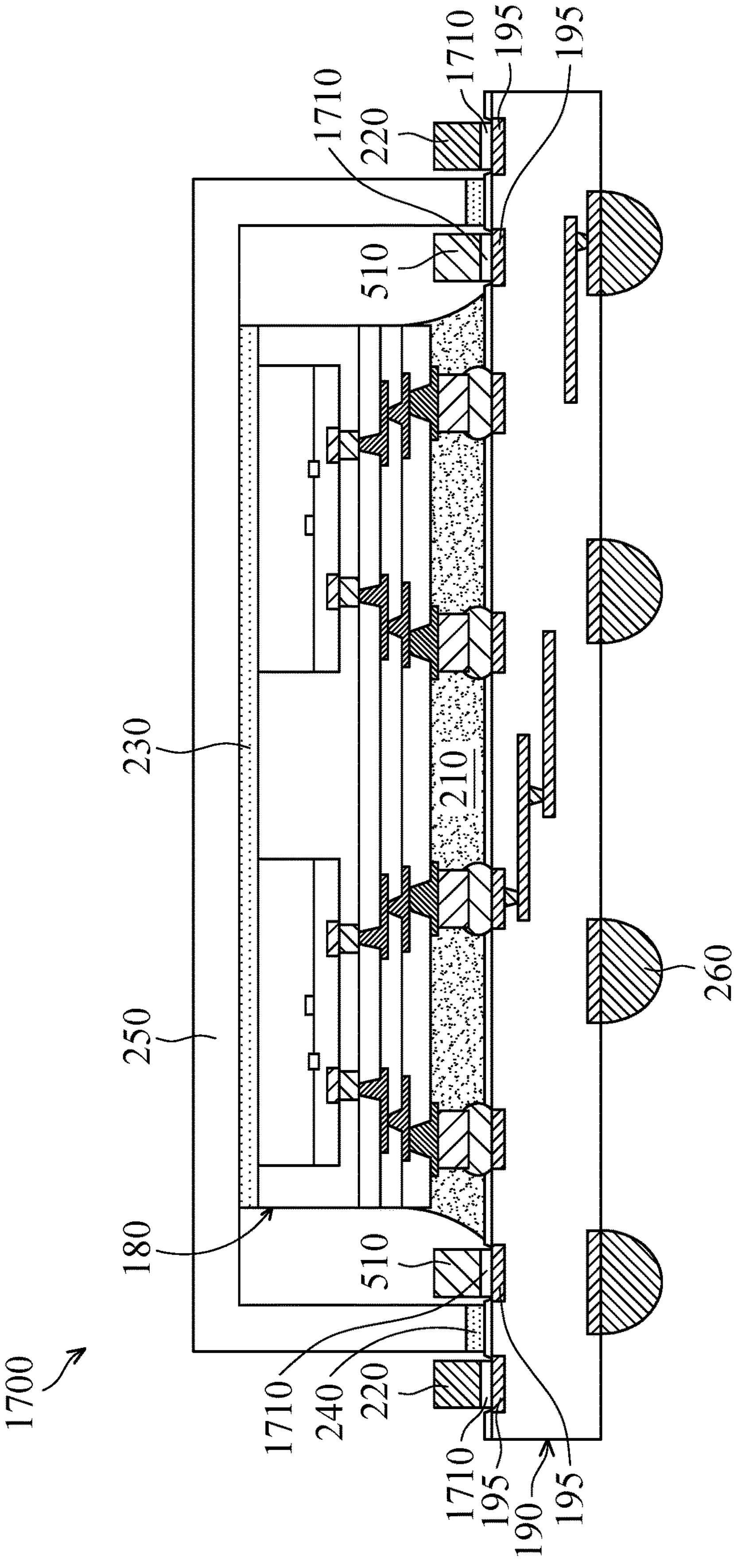
FIG. 17 is a cross-sectional view of a chip package structure, in accordance with some embodiments.

FIG. 17 is a cross-sectional view of a chip package structure 1700, in accordance with some embodiments. As shown in FIG. 17, the chip package structure 1700 is similar to the chip package structure 900 of FIG. 9A, except that the chip package structure 1700 further includes a solder layer 1710 between the anchor structures 220 and the conductive pads 195 thereunder and between the anchor structures 510 and the conductive pads 195 thereunder, in accordance with some embodiments.

The anchor structures 220 and 510 are bonded to the conductive pads 195 through the solder layer 1710, in accordance with some embodiments. The solder layer 1710 is made of a conductive material, such as a tin-based alloy, in accordance with some embodiments.

Figure 18:
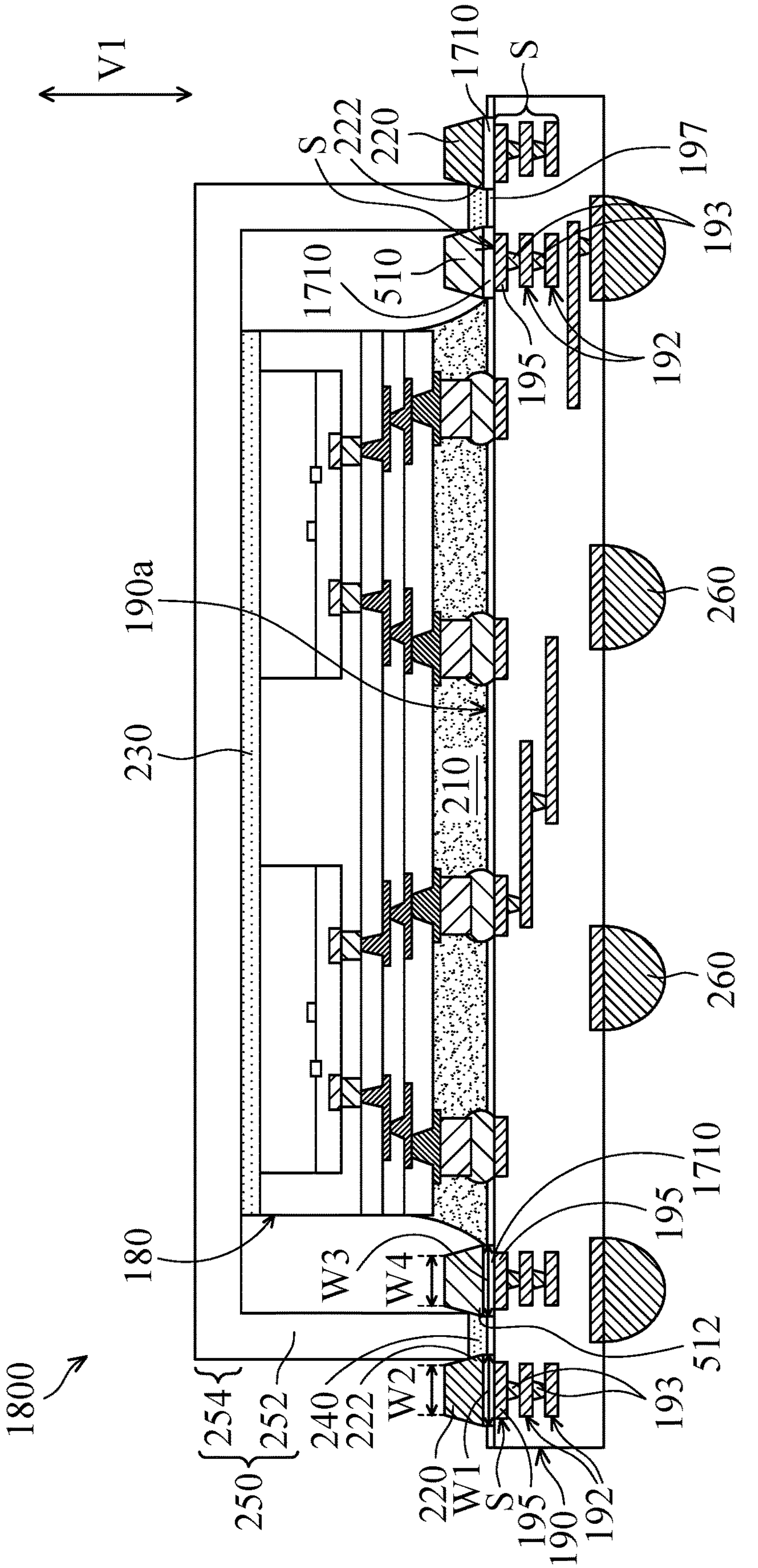
FIG. 18 is a cross-sectional view of a chip package structure, in accordance with some embodiments.

FIG. 18 is a cross-sectional view of a chip package structure 1800, in accordance with some embodiments. As shown in FIG. 18, the chip package structure 1800 is similar to the chip package structure 1700 of FIG. 17, except that the anchor structures 220 and 510 of the chip package structure 1800 have a trapezoid shape, such as an isosceles trapezoid shape, in accordance with some embodiments.

In some embodiments, a bottom width W1 of the anchor structure 220 is greater than a top width W2 of the anchor structure 220. In some embodiments, a bottom width W3 of the anchor structure 510 is greater than a top width W4 of the anchor structure 510.

In some embodiments, the lower portion 222 of the anchor structure 220 is between the lower portion 252 of the antiwarpage structure 250 and the wiring substrate 190. In some embodiments, the lower portion 512 of the anchor structure 510 is between the lower portion 252 and the wiring substrate 190. The anchor structures 220 and 510 are in direct contact with the adhesive layer 240 and the antiwarpage structure 250, in accordance with some embodiments.

The wiring substrate 190 of the chip package structure 1800 has stacking structures S under the anchor structures 220 and 510, in accordance with some embodiments. Each stacking structure S is composed of the conductive pad 195, the conductive vias 193, and the wiring layers 192 aligned with each other in a vertical direction V1, which is perpendicular to the surface 190*a* of the wiring substrate 190, in accordance with some embodiments.

In each stacking structure S, the conductive vias 193 and the wiring layers 192 under the conductive pad 195 are able to improve the bonding force between the conductive pad 195 and the dielectric layer 191, which improves the bonding force between the anchor structures 220 or 510 (or the solder layer 1710) and the wiring substrate 190, in accordance with some embodiments.

Figure 19:
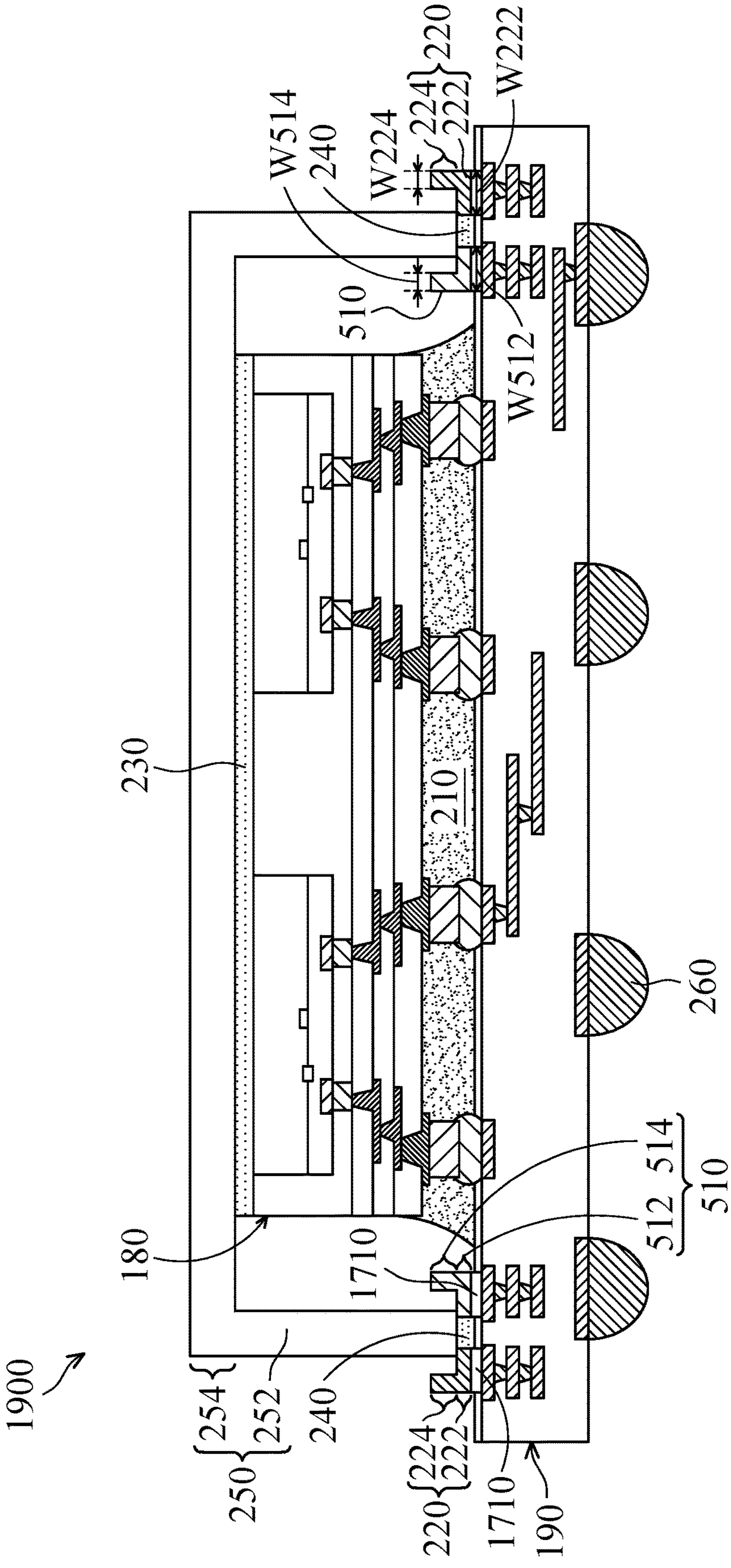
FIG. 19 is a cross-sectional view of a chip package structure, in accordance with some embodiments.

FIG. 19 is a cross-sectional view of a chip package structure 1900, in accordance with some embodiments. As shown in FIG. 19, the chip package structure 1900 is similar to the chip package structure 1800 of FIG. 18, except that the anchor structures 220 and 510 of the chip package structure 1900 have an L shape, in accordance with some embodiments.

In some embodiments, the lower portion 222 of the anchor structure 220 is between the lower portion 252 of the antiwarpage structure 250 and the wiring substrate 190. In some embodiments, the lower portion 512 of the anchor structure 510 is between the lower portion 252 and the wiring substrate 190. The anchor structures 220 and 510 are in direct contact with the adhesive layer 240 and the antiwarpage structure 250, in accordance with some embodiments.

In some embodiments, the width W224 of the upper portion 224 of the anchor structure 220 is less than the width W222 of the lower portion 222 of the anchor structure 220. In some embodiments, a ratio of the width W224 to the width W222 is greater than or equal to 0.2 and less than 1. If the ratio (W224/W222) is less than 0.2, the upper portion 224 may be too thin to reduce the shift quantity of the antiwarpage structure 250, in accordance with some embodiments.

In some embodiments, the width W514 of the upper portion 514 of the anchor structure 510 is less than the width W512 of the lower portion 512 of the anchor structure 510. In some embodiments, a ratio of the width W514 to the width W512 is greater than or equal to 0.2 and less than 1. If the ratio (W514/W512) is less than 0.2, the upper portion 514 may be too thin to reduce the shift quantity of the antiwarpage structure 250, in accordance with some embodiments.

Figure 20:
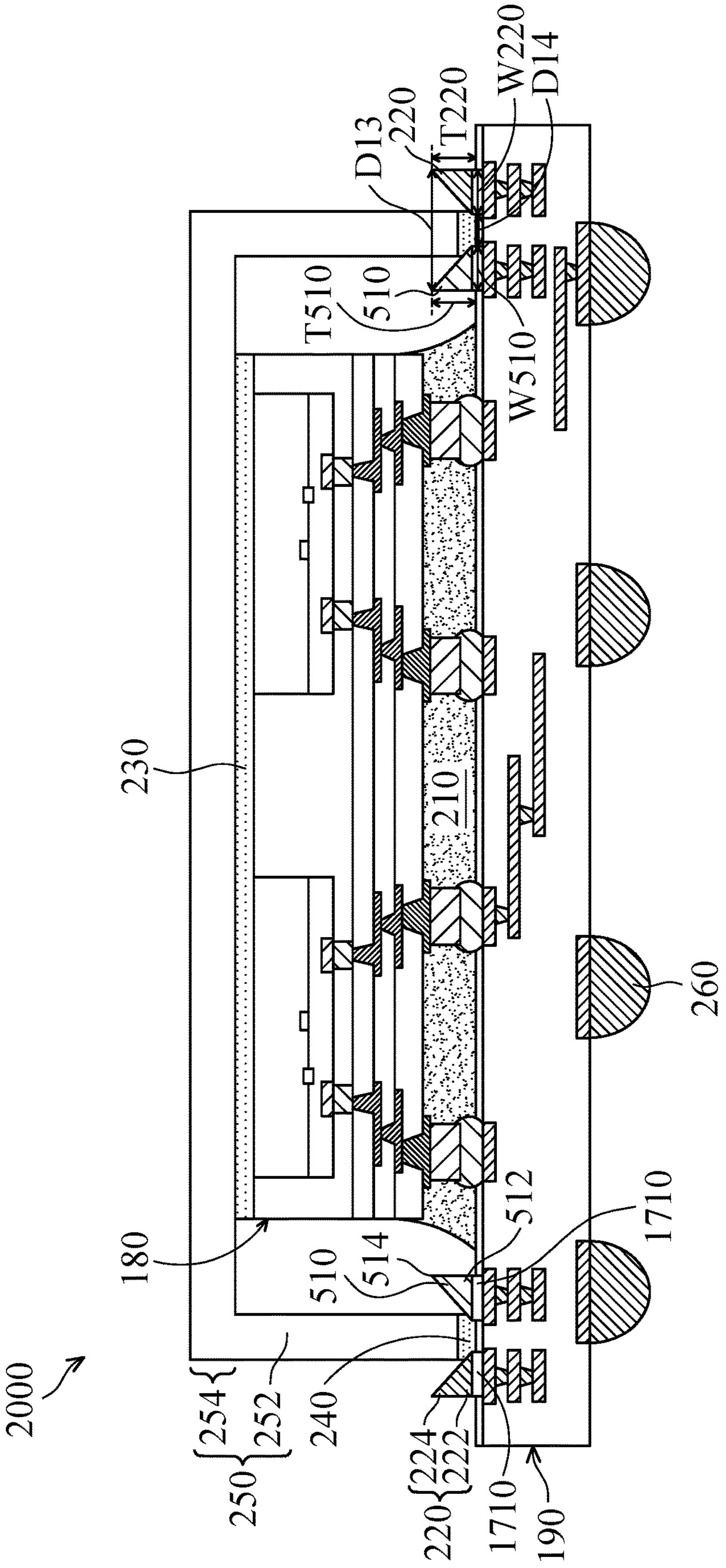
FIG. 20 is a cross-sectional view of a chip package structure, in accordance with some embodiments.

FIG. 20 is a cross-sectional view of a chip package structure 2000, in accordance with some embodiments. As shown in FIG. 20, the chip package structure 2000 is similar to the chip package structure 1800 of FIG. 18, except that the anchor structures 220 and 510 of the chip package structure 2000 have a triangle shape, in accordance with some embodiments.

In some embodiments, a distance D13 between the upper portions 224 and 514 of the anchor structures 220 and 510, which are adjacent to each other, is greater than a distance D14 between the lower portions 222 and 512 of the anchor structures 220 and 510. The distance D13 ranges from about 500 μm to about 4000 μm, in accordance with some embodiments. The distance D14 ranges from about 450 μm to about 2600 μm, in accordance with some embodiments. In some embodiments, a ratio of the distance D13 to the distance D14 is greater than 1 and less than or equal to 1.5.

In some embodiments, a thickness T220 of the anchor structure 220 ranges from about 100 μm to about 500 μm. In some embodiments, a width W220 of the anchor structure 220 ranges from about 100 μm to about 500 μm. In some embodiments, a ratio of the thickness T220 to the width W220 ranges from about 0.7 to about 1.3. In some embodiments, the ratio of the thickness T220 to the width W220 is substantially equal to 1.

In some embodiments, a thickness T510 of the anchor structure 510 ranges from about 100 μm to about 500 μm. In some embodiments, a width W510 of the anchor structure 510 ranges from about 100 μm to about 500 μm. In some embodiments, a ratio of the thickness T510 to the width W510 ranges from about 0.7 to about 1.3. In some embodiments, the ratio of the thickness T510 to the width W510 is substantially equal to 1.

In some embodiments, the lower portion 222 of the anchor structure 220 is between the lower portion 252 of the antiwarpage structure 250 and the wiring substrate 190. In some embodiments, the lower portion 512 of the anchor structure 510 is between the lower portion 252 and the wiring substrate 190. The anchor structures 220 and 510 are in direct contact with the adhesive layer 240, in accordance with some embodiments.

Figure 21:
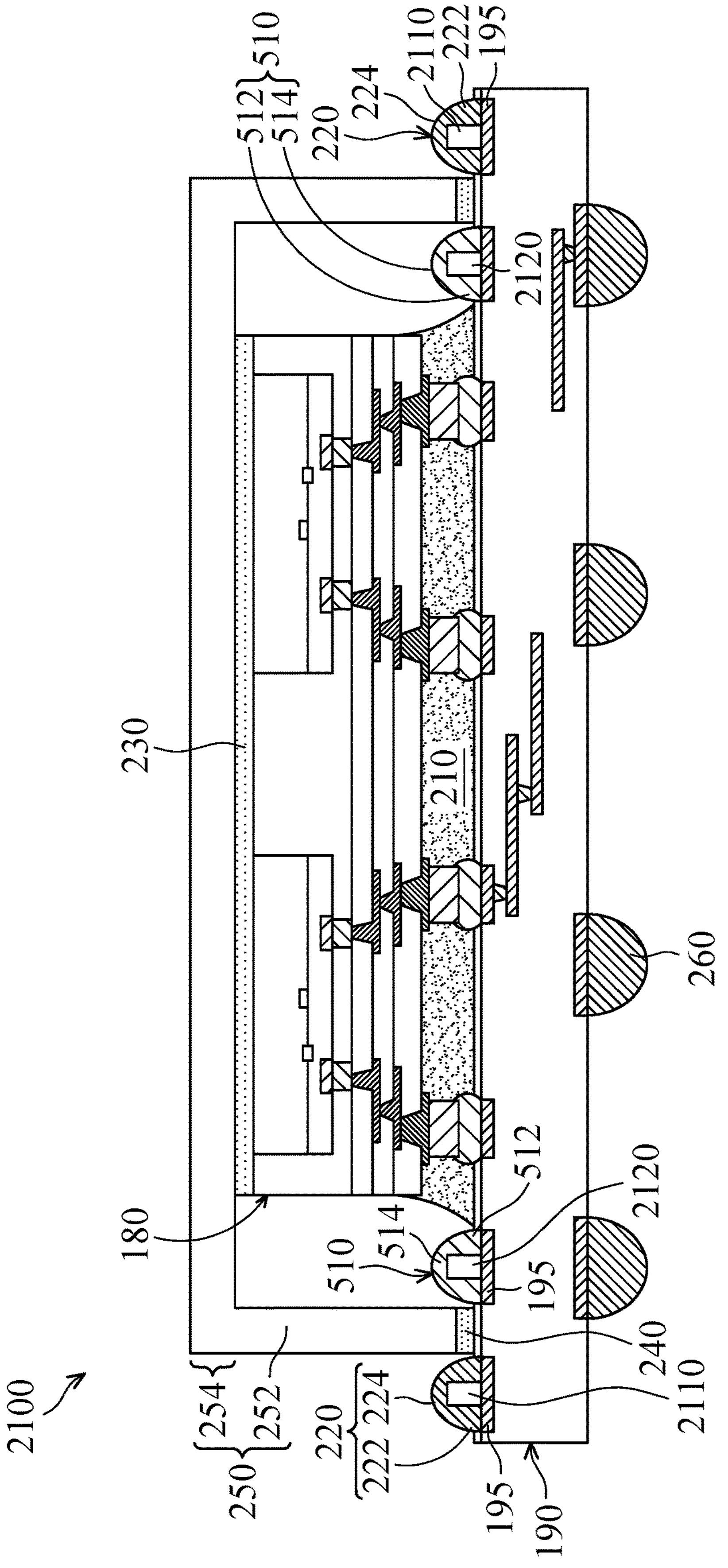
FIG. 21 is a cross-sectional view of a chip package structure, in accordance with some embodiments.

FIG. 21 is a cross-sectional view of a chip package structure 2100, in accordance with some embodiments. As shown in FIG. 21, the chip package structure 2100 is similar to the chip package structure 1500 of FIG. 15, except that the chip package structure 2100 further includes metal studs 2110 and 2120, in accordance with some embodiments.

The metal studs 2110 and 2120 are formed over the conductive pads 195, in accordance with some embodiments. The anchor structures 220 are formed over the respective metal studs 2110, in accordance with some embodiments. The anchor structures 510 are formed over the respective metal studs 2120, in accordance with some embodiments.

The metal studs 2110 and 2120 are made of metal (e.g. gold, copper, aluminum, or tungsten) or alloys thereof, in accordance with some embodiments. The metal studs 2110 and 2120 are formed using a plating process, such as an electroplating process, in accordance with some embodiments. The anchor structures 220 and 510 are made of a conductive material, such as a tin-based alloy, in accordance with some embodiments.

Figure 22:
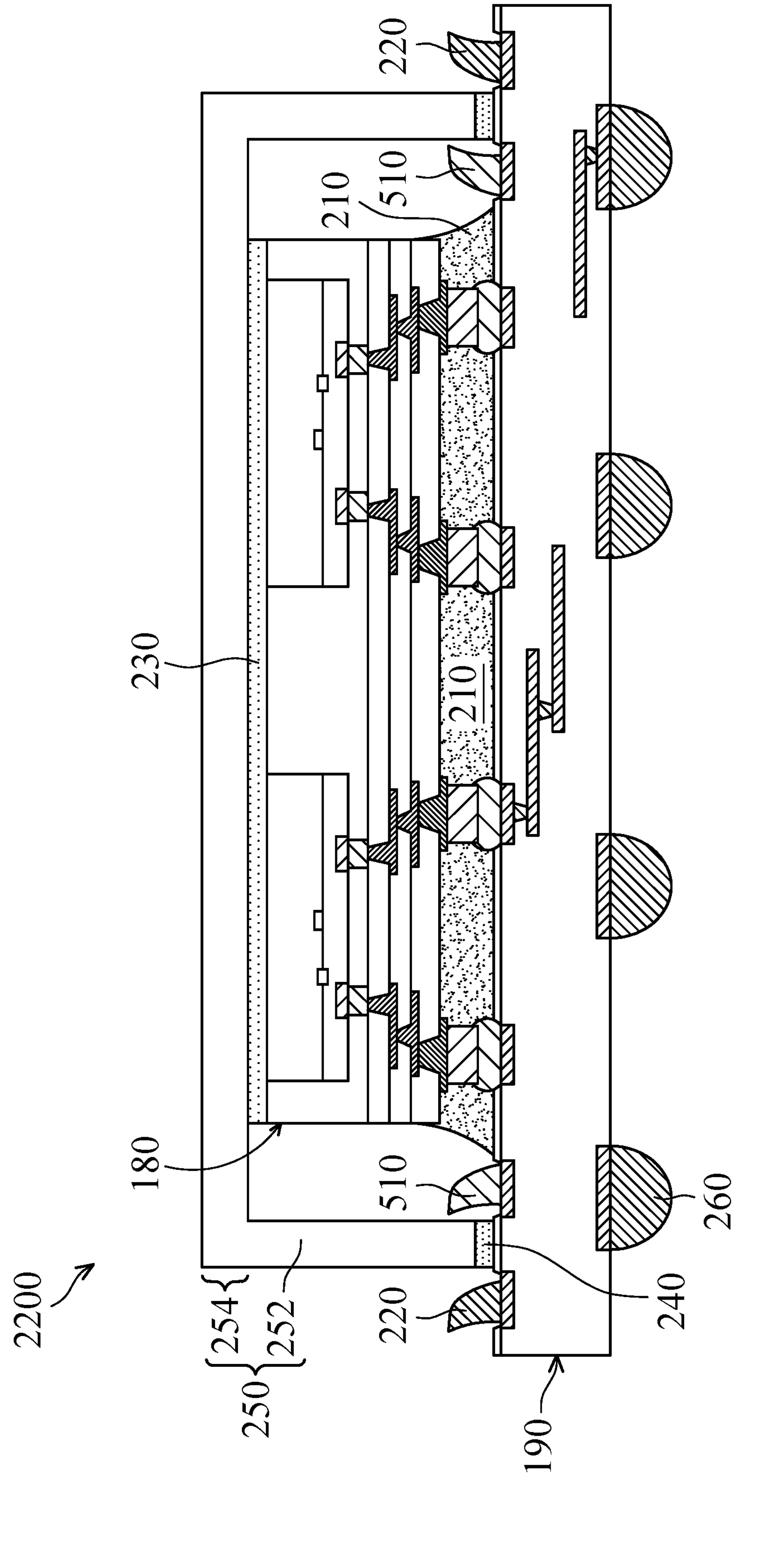
FIG. 22 is a cross-sectional view of a chip package structure, in accordance with some embodiments.

FIG. 22 is a cross-sectional view of a chip package structure 2200, in accordance with some embodiments. As shown in FIG. 22, the chip package structure 2200 is similar to the chip package structure 1400 of FIG. 14, except that the anchor structures 220 and 510 of the chip package structure 2200 are wires, in accordance with some embodiments.

The anchor structures 220 and 510 are made of metal (e.g. copper or gold) or alloys thereof, in accordance with some embodiments. The anchor structures 220 and 510 are formed using a wire bonding process, in accordance with some embodiments.

Figure 23:
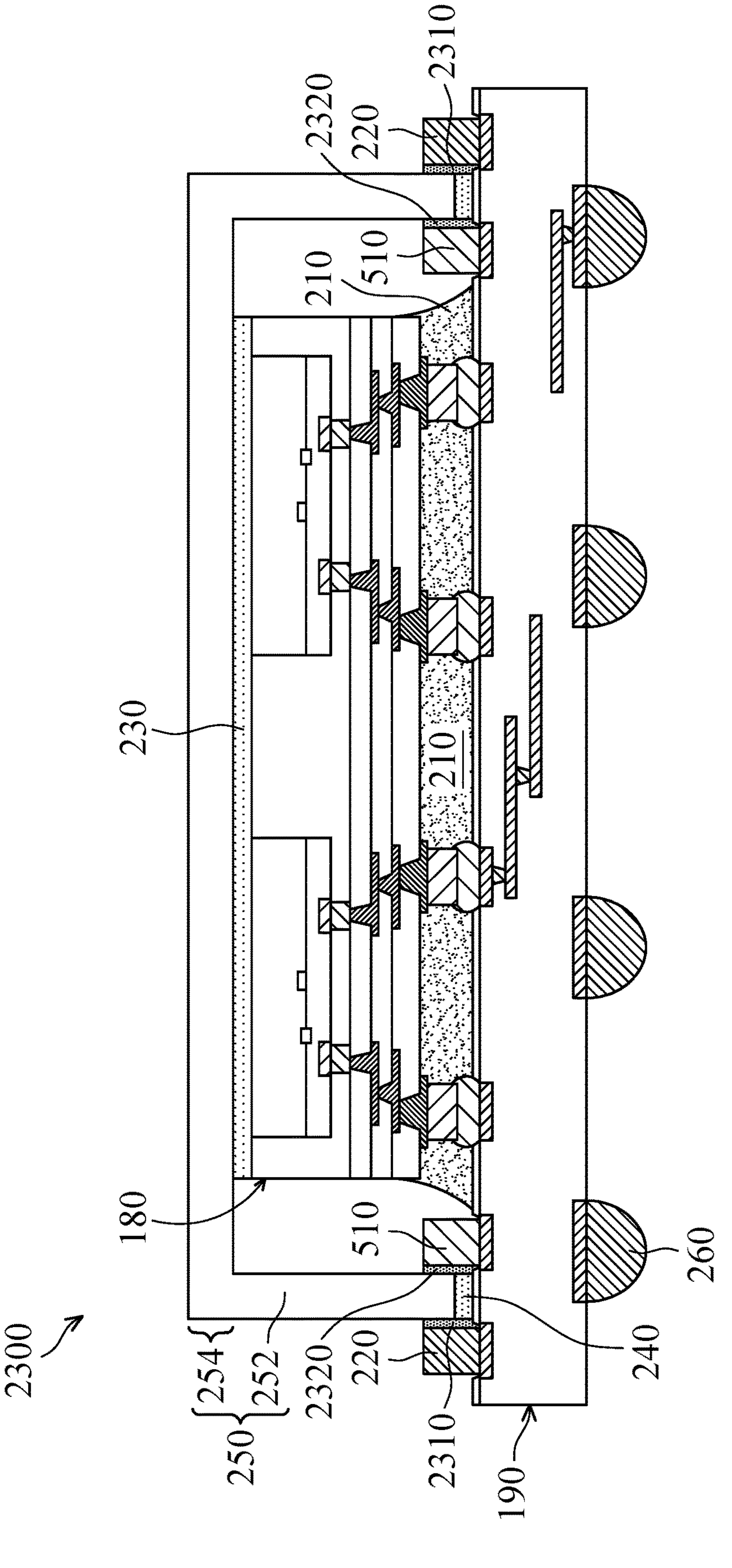
FIG. 23 is a cross-sectional view of a chip package structure, in accordance with some embodiments.

FIG. 23 is a cross-sectional view of a chip package structure 2300, in accordance with some embodiments. As shown in FIG. 23, the chip package structure 2300 is similar to the chip package structure 900 of FIG. 9A, except that the chip package structure 2300 further includes conductive adhesive layers 2310 and 2320, in accordance with some embodiments.

The conductive adhesive layer 2310 is between the anchor structure 220 and the lower portion 252 of the antiwarpage structure 250, in accordance with some embodiments. The conductive adhesive layer 2320 is between the anchor structure 510 and the lower portion 252, in accordance with some embodiments.

The conductive adhesive layers 2310 and 2320 are made of a conductive paste, such as a silver paste, in accordance with some embodiments. The anchor structures 220 and 510 are electrically connected to the antiwarpage structure 250 through the conductive adhesive layers 2310 and 2320, in accordance with some embodiments. The anchor structures 220 and 510, the conductive adhesive layers 2310 and 2320, and the antiwarpage structure 250 together form an electromagnetic interference (EMI) shielding structure, in accordance with some embodiments.

In some embodiments, the conductive adhesive layer 2310 is formed before the antiwarpage structure 250 is bonded to the adhesive layers 230 and 240. In some other embodiments, the conductive adhesive layer 2310 is formed after the antiwarpage structure 250 is bonded to the adhesive layers 230 and 240. In some embodiments, the conductive adhesive layer 2320 is formed before the antiwarpage structure 250 is bonded to the adhesive layers 230 and 240.

Figure 24:
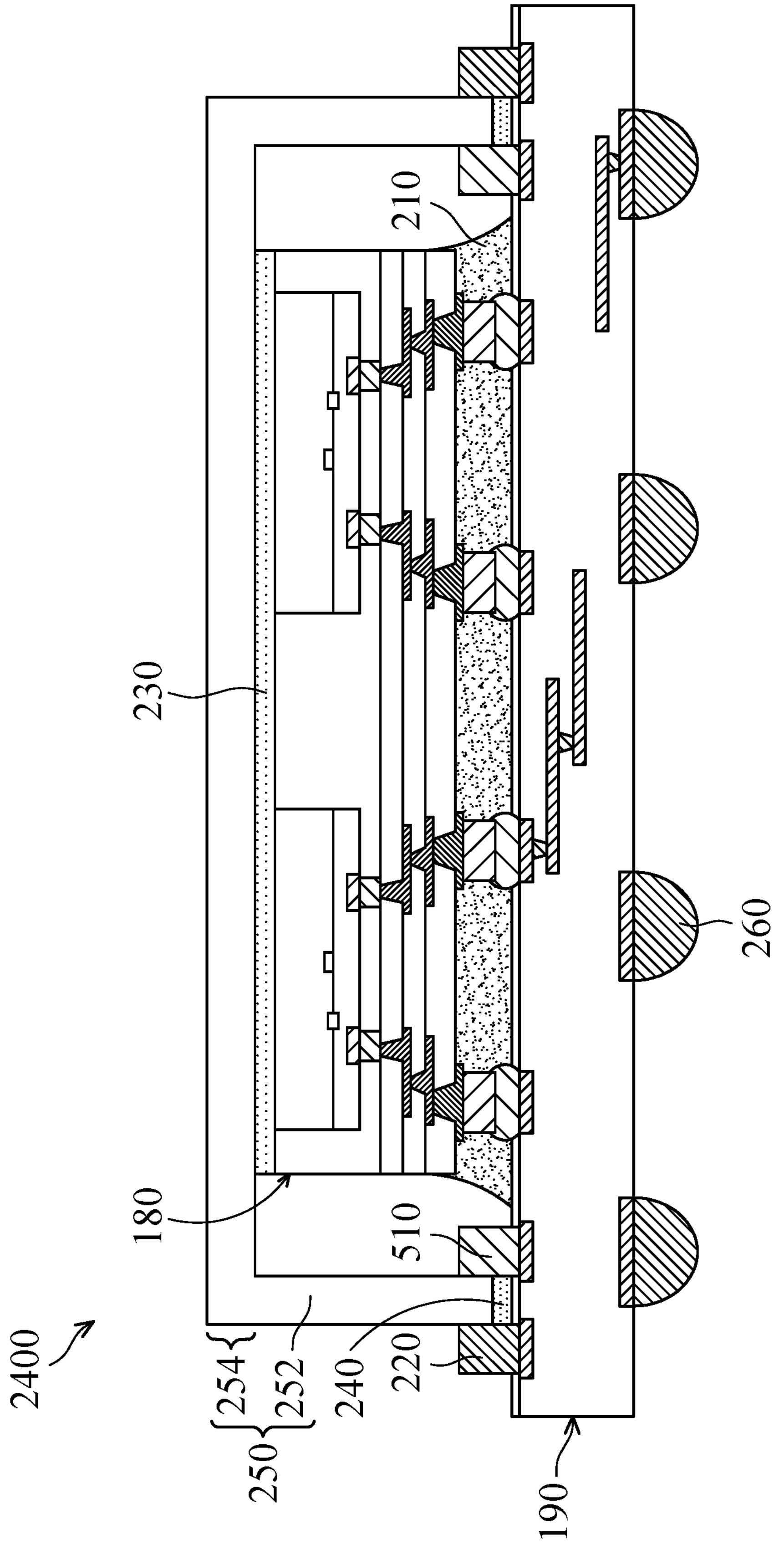
FIG. 24 is a cross-sectional view of a chip package structure, in accordance with some embodiments.

FIG. 24 is a cross-sectional view of a chip package structure 2400, in accordance with some embodiments. As shown in FIG. 24, the chip package structure 2300 is similar to the chip package structure 900 of FIG. 9A, except that the anchor structures 220 and 510 are in direct contact with the antiwarpage structure 250, in accordance with some embodiments. The anchor structures 220 and 510 are electrically connected to the antiwarpage structure 250, in accordance with some embodiments. The anchor structures 220 and 510 and the antiwarpage structure 250 together form an electromagnetic interference shielding structure, in accordance with some embodiments.

Figure 25:
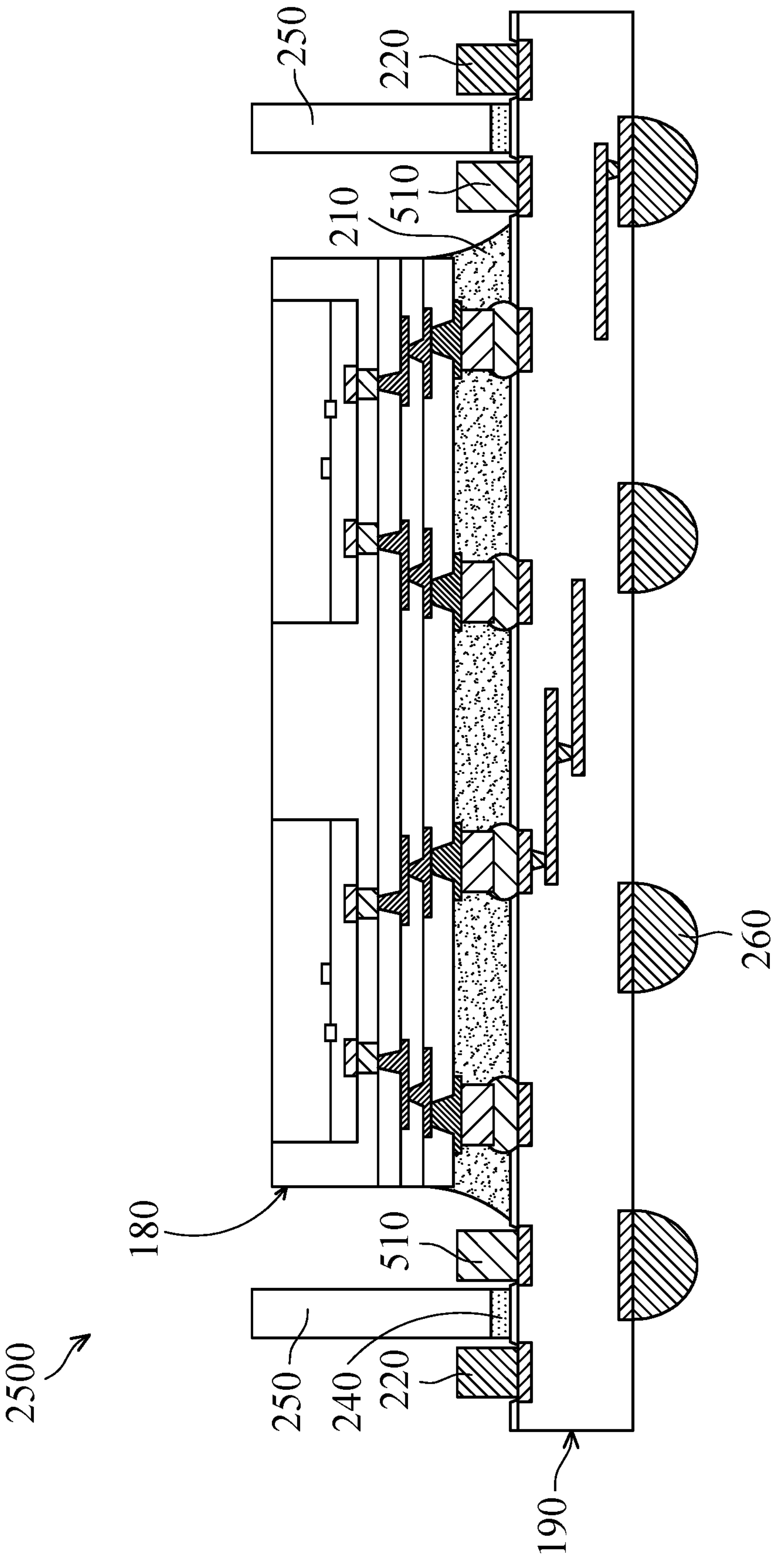
FIG. 25 is a cross-sectional view of a chip package structure, in accordance with some embodiments.

FIG. 25 is a cross-sectional view of a chip package structure 2500, in accordance with some embodiments. As shown in FIG. 25, the chip package structure 2500 is similar to the chip package structure 900 of FIG. 9A, except that the antiwarpage structure 250 is a ring structure, in accordance with some embodiments. The antiwarpage structure 250 continuously surrounds the entire chip structure 180 and all of the anchor structures 510, in accordance with some embodiments.

Figure 26:
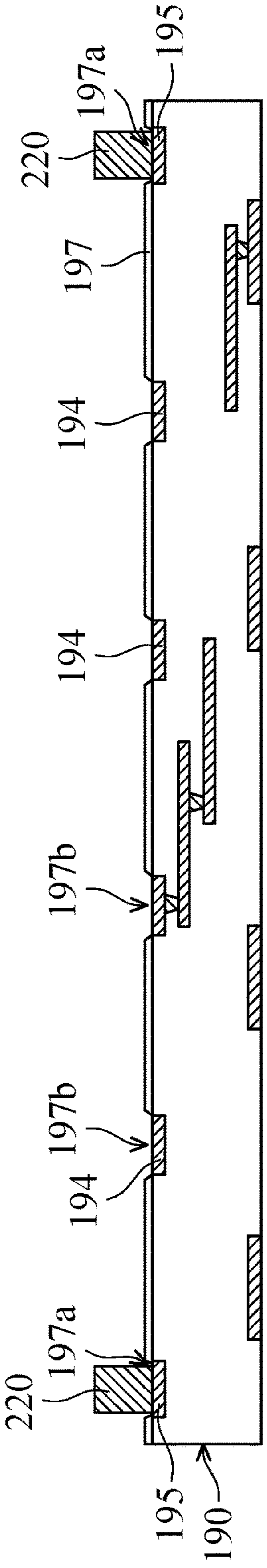
FIG. 26 is a cross-sectional view of a stage of a process for forming a chip package structure, in accordance with some embodiments.

In some embodiments, the anchor structures 220 are formed before bonding the chip structure 180 to the wiring substrate 190, in accordance with some embodiments. FIG. 26 is a cross-sectional view of a stage of a process for forming a chip package structure, in accordance with some embodiments.

As shown in FIG. 26, the anchor structures 220 are formed over the respective conductive pads 195 of the wiring substrate 190, in accordance with some embodiments. The anchor structures 220 are in the respective openings 197*a* of the insulating layer 197, in accordance with some embodiments. Thereafter, the steps of FIGS. 1C, 1E, and 1F are performed, in accordance with some embodiments.

The anchor structures 220 are made of a material with a melting point higher than that of the solder bumps 170 of FIG. 1C, in accordance with some embodiments. Therefore, the shape of the anchor structures 220 is maintained after the bonding process of the chip structure 180 and the wiring substrate 190, which includes an annealing step to melt the solder bumps 170 of FIG. 1C, in accordance with some embodiments. The anchor structures 220 are made of a rigid material, such as metal (iron, copper, aluminum, or tungsten) or alloys thereof, in accordance with some embodiments.

Figure 27A:
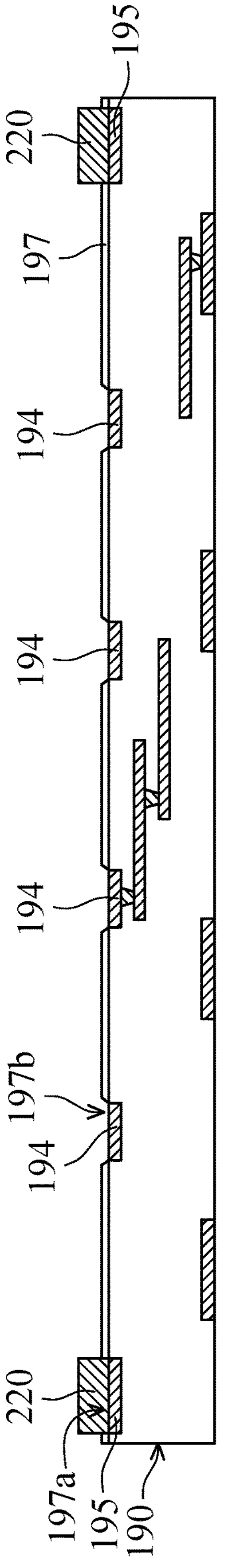
FIGS. 27A-27B are cross-sectional views of various stages of a process for forming a chip package structure, in accordance with some embodiments.
Figure 27B:
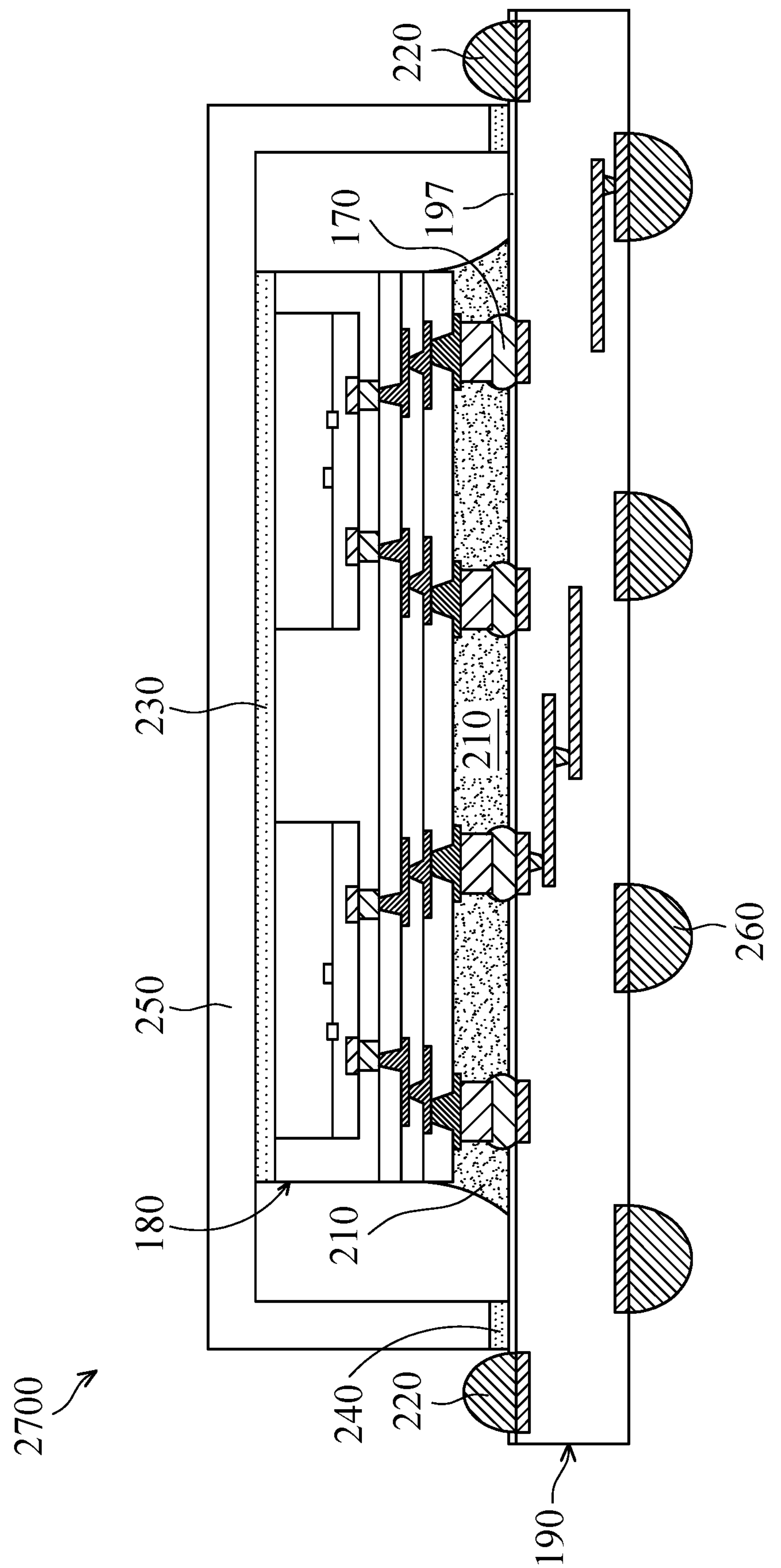

FIGS. 27A-27B are cross-sectional views of various stages of a process for forming a chip package structure 2700, in accordance with some embodiments. As shown in FIG. 27A, the anchor structures 220 are formed over the respective conductive pads 195 of the wiring substrate 190, in accordance with some embodiments.

Thereafter, as shown in FIG. 27B, the steps of FIGS. 1C, 1E, and 1F are performed to form the chip package structure 2700, in accordance with some embodiments. The anchor structures 220 are made of a material with a melting point substantially equal to or lower than that of the solder bumps 170, in accordance with some embodiments.

The bonding process of the chip structure 180 and the wiring substrate 190 includes an annealing step to melt the solder bumps 170, and therefore the anchor structures 220 are also melted during the annealing step, in accordance with some embodiments. Therefore, the shape of the anchor structures 220 is rounded after the annealing step, in accordance with some embodiments. The anchor structures 220 are made of a rigid material, such as tin or alloys thereof, in accordance with some embodiments.

Figure 28:
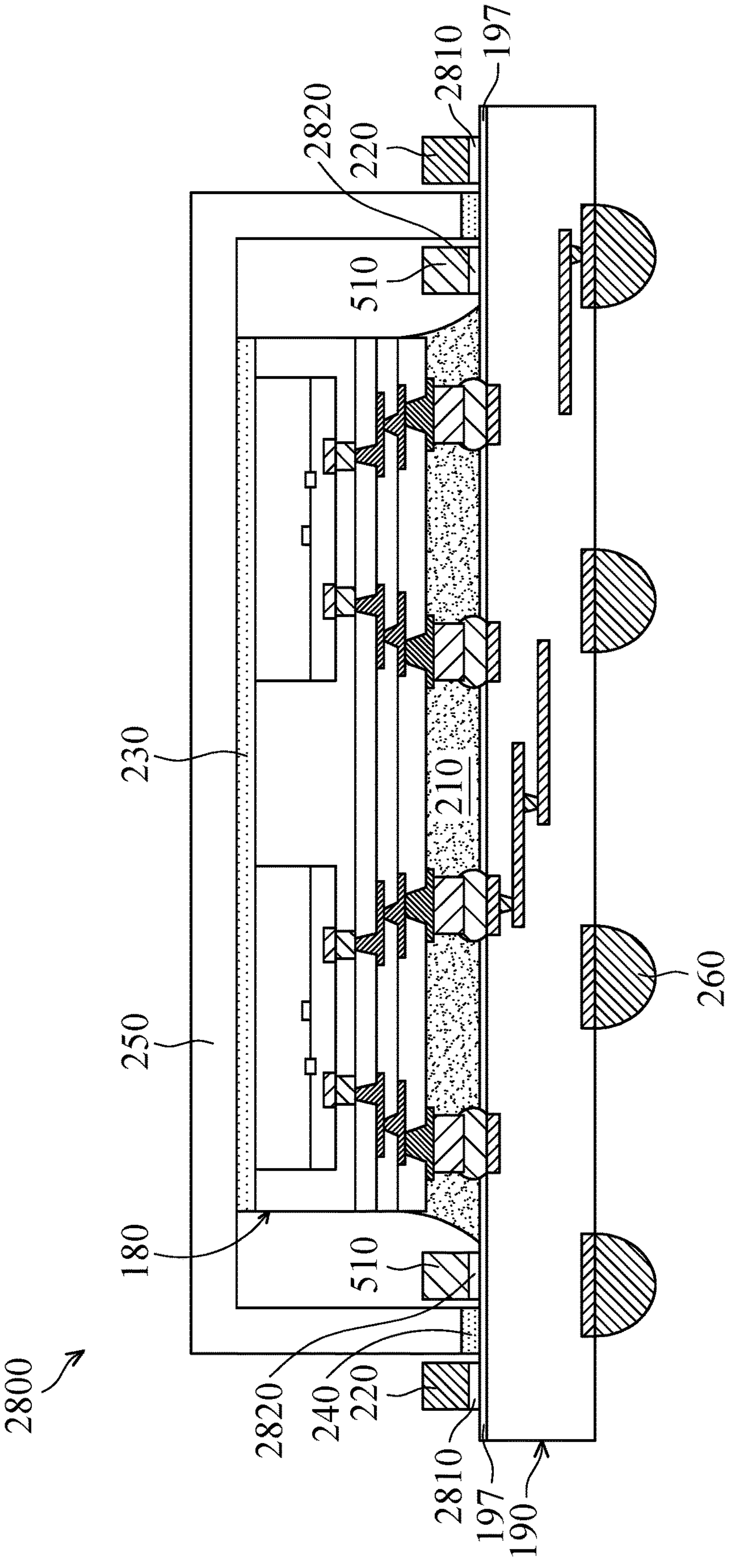
FIG. 28 is a cross-sectional view of a chip package structure, in accordance with some embodiments.

FIG. 28 is a cross-sectional view of a chip package structure 2800, in accordance with some embodiments. The chip package structure 2800 is similar to the chip package structure 1700 of FIG. 17, except that the anchor structures 220 are bonded to the insulating layer 197 of the wiring substrate 190 through an adhesive layer 2810 therebetween, and the anchor structures 510 are bonded to the insulating layer 197 through an adhesive layer 2820 therebetween, in accordance with some embodiments.

The adhesive layers 2810 and 2820 are made of a polymer material or another suitable material. In some embodiments, the adhesive layers 2810 and 2820 are made of the same material. In some other embodiments, the adhesive layers 2810 and 2820 are made of different materials.

The anchor structures 220 and 510 are made of a rigid material, such as a metal material, an alloy material, or a non-metallic material, in accordance with some embodiments. The non-metallic material includes a glass material, a ceramic material, a polymer material, or a semiconductor material, in accordance with some embodiments.

Processes and materials for forming the chip package structures 200, 300, 400, 500, 600, 700, 800, 900, 1000, 1100, 1200, 1300, 1400, 1500, 1600, 1700, 1800, 1900, 2000, 2100, 2200, 2300, 2400, 2500, 2700, and 2800 may be similar to, or the same as, those for forming the chip package structure 100 described above. Elements designated by the same reference numbers as those in FIGS. 1A to 25 have the structures and the materials similar to or the same as each other. Therefore, the detailed descriptions thereof will not be repeated herein.

In accordance with some embodiments, chip package structures and methods for forming the same are provided. The methods (for forming the chip package structure) form anchor structures over a wiring substrate and adjacent to a lower portion of an antiwarpage structure (e.g., an antiwarpage ring or an antiwarpage cap). The anchor structures are used as bonding guide structures to align the lower portion with an adhesive layer over the wiring substrate during bonding the lower portion to the adhesive layer. Therefore, the bonding accuracy between the lower portion and the adhesive layer is improved, which improves the adhesion between the antiwarpage structure and the wiring substrate and therefore reduces the warpage of the wiring substrate. As a result, the coplanarity of conductive bumps, which are formed over the wiring substrate, is improved, which improves the yield of the process of bonding the chip package structure to a substrate or another device through the conductive bumps. Furthermore, the anchor structures are able to limit the antiwarpage structure in a predetermined region, which prevents the antiwarpage structure from shifting in subsequent processes. Therefore, the anchor structures are able to improve the structural stability of the chip package structure.

In accordance with some embodiments, a chip package structure is provided. The chip package structure includes a wiring substrate having a first conductive pad. The chip package structure includes a chip structure over the wiring substrate. The chip package structure includes an antiwarpage structure over the wiring substrate. The antiwarpage structure surrounds the chip structure. The chip package structure includes a first anchor structure on the first conductive pad of the wiring substrate and adjacent to a first lower portion of the antiwarpage structure. The first lower portion is between the first anchor structure and the chip structure, and the first anchor structure and the first conductive pad are electrically insulated from the chip structure.

In accordance with some embodiments, a chip package structure is provided. The chip package structure includes a wiring substrate having a surface. The chip package structure includes a chip structure over the surface of the wiring substrate. The chip structure includes a chip. The chip package structure includes an antiwarpage structure over the surface of the wiring substrate. The antiwarpage structure surrounds the chip structure. The chip package structure includes a first anchor structure bonded to the surface of the wiring substrate and adjacent to a first lower portion of the antiwarpage structure. The first anchor structure is between the chip structure and the first lower portion, a top surface of the first anchor structure is lower than a bottom surface of the chip, and the first anchor structure is electrically isolated from the chip structure.

In accordance with some embodiments, a chip package structure is provided. The chip package structure includes a wiring substrate having a surface. The chip package structure includes a chip structure over the surface of the wiring substrate. The chip package structure includes a first anchor structure bonded to the surface of the wiring substrate. The first anchor structure has an opening, the chip structure is in the opening, and the first anchor structure is electrically isolated from the chip structure. The chip package structure includes an antiwarpage structure over the surface of the wiring substrate. The antiwarpage structure surrounds the chip structure and is between the chip structure and the first anchor structure. The chip package structure includes a first conductive adhesive layer between the first anchor structure and the antiwarpage structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:

a wiring substrate having a first conductive pad;

a chip structure over the wiring substrate;

an antiwarpage structure over the wiring substrate, wherein the antiwarpage structure surrounds the chip structure; and a first anchor structure on the first conductive pad of the wiring substrate and adjacent to a first lower portion of the antiwarpage structure, wherein the first lower portion is between the first anchor structure and the chip structure, a top surface of the first anchor structure is higher than a bottom surface of the antiwarpage structure, and the first anchor structure and the first conductive pad are electrically insulated from the chip structure.

2. The chip package structure as claimed in claim 1, wherein the first anchor structure is closer to the first lower portion of the antiwarpage structure than the chip structure.

3. The chip package structure as claimed in claim 1, wherein the first anchor structure comprises a pillar structure or a strip structure.

4. The chip package structure as claimed in claim 1, wherein the first anchor structure comprises a ring structure, and the first anchor structure continuously surrounds the chip structure in a top view of the first anchor structure and the chip structure.

5. The chip package structure as claimed in claim 1, wherein a second lower portion of the first anchor structure is closer to the antiwarpage structure than an upper portion of the first anchor structure.

6. The chip package structure as claimed in claim 1, further comprising:

a second anchor structure over the wiring substrate and adjacent to a second lower portion of the antiwarpage structure, wherein the chip structure is between the first lower portion and the second lower portion of the antiwarpage structure, the second lower portion is between the second anchor structure and the chip structure, and the second anchor structure is electrically isolated from the chip structure.

7. The chip package structure as claimed in claim 6, wherein a first distance between a first upper portion of the first anchor structure and a second upper portion of the second anchor structure is greater than a second distance between a third lower portion of the first anchor structure and a fourth lower portion of the second anchor structure.

8. The chip package structure as claimed in claim 6, wherein the second anchor structure is on a second conductive pad of the wiring substrate, and the second conductive pad is electrically isolated from the chip structure.

9. The chip package structure as claimed in claim 1, wherein the antiwarpage structure extends across opposite sidewalls of the first anchor structure.

10. A chip package structure, comprising:

a wiring substrate having a surface;

a chip structure over the surface of the wiring substrate, wherein the chip structure comprises a chip;

an antiwarpage structure over the surface of the wiring substrate, wherein the antiwarpage structure surrounds the chip structure; and a first anchor structure bonded to the surface of the wiring substrate and adjacent to a first lower portion of the antiwarpage structure, wherein the first anchor structure is between the chip structure and the first lower portion, a top surface of the first anchor structure is lower than a bottom surface of the chip, a second lower portion of the first anchor structure is between the first lower portion of the antiwarpage structure and the wiring substrate, and the first anchor structure is electrically isolated from the chip structure.

11. The chip package structure as claimed in claim 10, wherein the first lower portion is closer to the first anchor structure than the chip structure.

12. The chip package structure as claimed in claim 10, wherein a first upper portion of the first anchor structure is narrower than a second lower portion of the first anchor structure.

13. The chip package structure as claimed in claim 10, further comprising:

a second anchor structure bonded to the surface of the wiring substrate, wherein the first lower portion of the antiwarpage structure is between the first anchor structure and the second anchor structure.

14. The chip package structure as claimed in claim 13, wherein a first distance between a first upper portion of the first anchor structure and a second upper portion of the second anchor structure is greater than a second distance between a second lower portion of the first anchor structure and a third lower portion of the second anchor structure.

15. The chip package structure as claimed in claim 10, wherein the first anchor structure is in direct contact with the antiwarpage structure.

16. The chip package structure as claimed in claim 10, further comprising:

a conductive layer connected between the first anchor structure and the antiwarpage structure.

17. A chip package structure, comprising:

a wiring substrate having a surface;

a chip structure over the surface of the wiring substrate;

a first anchor structure bonded to the surface of the wiring substrate, wherein the first anchor structure has an opening, the chip structure is in the opening, and the first anchor structure is electrically isolated from the chip structure;

an antiwarpage structure over the surface of the wiring substrate, wherein the antiwarpage structure surrounds the chip structure and is between the chip structure and the first anchor structure;

a first conductive adhesive layer between the first anchor structure and the antiwarpage structure;

a second anchor structure over the surface of the wiring substrate, wherein the second anchor structure is between the chip structure and the antiwarpage structure; and a second conductive adhesive layer between the second anchor structure and the antiwarpage structure.

18. The chip package structure as claimed in claim 17, further comprising:

an adhesive layer over the surface of the wiring substrate, wherein the antiwarpage structure is bonded to the adhesive layer, and the first conductive adhesive layer is in direct contact with the adhesive layer.

19. The chip package structure as claimed in claim 17, wherein the anchor structure has a slanted sidewall.

20. The chip package structure as claimed in claim 17, wherein the anchor structure has a curved sidewall.

* * * * *